United States Patent
McDowell

(10) Patent No.: US 9,285,441 B1
(45) Date of Patent: Mar. 15, 2016

(54) MAGNETIC FIELD CORRECTION SYSTEM

(75) Inventor: Andrew F McDowell, Albuquerque, NM (US)

(73) Assignee: ABQMR, INC., Albuquerque, NM (US)

( * ) Notice: Subject to any disclaimer, the term of this patent is extended or adjusted under 35 U.S.C. 154(b) by 891 days.

(21) Appl. No.: 13/492,618

(22) Filed: Jun. 8, 2012

Related U.S. Application Data

(60) Provisional application No. 61/520,322, filed on Jun. 8, 2011.

(51) Int. Cl.
*G01R 33/34* (2006.01)

(52) U.S. Cl.
CPC .............................. *G01R 33/34046* (2013.01)

(58) Field of Classification Search
CPC .................................................... A01B 12/006
See application file for complete search history.

(56) References Cited

U.S. PATENT DOCUMENTS

| | | | |
|---|---|---|---|
| 4,631,481 A | 12/1986 | Young et al. | |
| 5,235,284 A | 8/1993 | Tahara et al. | |
| 5,343,183 A | 8/1994 | Shimada et al. | |
| 5,603,320 A * | 2/1997 | Dumoulin et al. | 600/423 |
| 6,313,634 B1 | 11/2001 | Kasten | |
| 6,437,567 B1 * | 8/2002 | Schenck et al. | 324/318 |
| 7,088,104 B2 * | 8/2006 | Bottomley | G01R 33/3415 324/322 |
| 7,282,915 B2 * | 10/2007 | Giaquinto | G01R 33/3415 324/318 |
| 7,459,909 B2 * | 12/2008 | Yao et al. | 324/320 |
| 7,663,367 B2 * | 2/2010 | Wiggins | A61B 5/055 324/309 |
| 7,701,220 B2 * | 4/2010 | Ehnholm | G01R 33/3415 324/318 |
| 9,000,766 B2 * | 4/2015 | Chu | G01R 33/34084 324/318 |
| 2011/0137589 A1 | 6/2011 | Leskowitz et al. | |

OTHER PUBLICATIONS

Anderson, W., "Electrical Current Shims for Correcting Magnetic Fields," The Review of Scientific Instruments, Mar. 1961, pp. 241-250, vol. 32, No. 3, Amer. Inst. of Physics.

* cited by examiner

*Primary Examiner* — Dixomara Vargas
(74) *Attorney, Agent, or Firm* — Rod D. Baker

(57) ABSTRACT

A magnetic field correction system including apparatus and method for adjusting a magnetic field is provided, for example to enhance the uniformity of the field in a Nuclear Magnetic Resonance (NMR) operation. The system is of an electronic "shimming" type. The layout of the wires of the shim coils is simplified to conserve working space inside a magnet, such as an NMR magnet. The complexity of the shimming system is removed from the coils and transferred to the current controlling electronics. The current paths do not require cross-over points, and groups of parallel wires are arranged such that the wire groups have axes with different directional orientations. By deploying such shim wire groups in differently oriented axial directions, a compact shimming apparatus is provided for generating a controllable corrective magnetic field for adjusting a main original field, such as to enhance the homogeneity of the main field.

24 Claims, 21 Drawing Sheets

MAGNETIC FIELD CORRECTION SYSTEM

CROSS-REFERENCE TO RELATED APPLICATIONS

This application claims the benefit of the filing of U.S. Provisional Patent Application Ser. No. 61/520,322 titled "Magnetic Field Correction System," filed on 8 Jun. 2011, and the specification thereof is incorporated herein by reference.

FIELD OF THE INVENTION

This invention relates generally to methods and apparatuses for homogenizing or correcting the magnetic fields of magnets, particularly with the magnetic fields employed in nuclear magnetic resonance (NMR) systems. The invention has more particularly to do with "shim coils" for making such field homogenizations or corrections, and specifically to systems for creating desirable correction fields in which the complexity of the shim coil system effectively is transferred from the physical coils to the systems' current-controlling electronics and software.

BACKGROUND OF THE INVENTION

Strong, uniform magnetic fields are desirable in many situations. Examples include scientific instruments, devices for measuring important industrial parameters, apparatus for achieving certain effects on samples or materials, devices for education or student experimentation in courses, and many others. Often, the effectiveness of a device or phenomenon that relies on, or incorporates, a magnetic field in its operation will be improved if the uniformity of the field strength is enhanced. Such operational improvements may be increases in speed, efficiency, precision, resolution, sensitivity, or enhancements to other features or functions of the device, measurement, or process. A more uniform magnetic field may also allow the use of smaller, weaker, and/or less expensive magnets to achieve the desired goal.

Many methods for homogenizing or correcting the magnetic field of magnets have been developed. Mechanical methods, including precise design and shaping of the magnet's pieces, attention to accurate positioning during the assembly of the magnet, careful selection of uniform and/or matched pieces of permanent magnetic material, and careful adjustment of the relative positions of the magnet pieces after initial assembly, have been used. Post-assembly mechanical adjustments, including screws to move some or all of the positions of the magnet's constituent pieces, movement of magnet pieces that control the distribution of magnetic flux lines in space, additions of extra pieces of material on the surface of or in the interior and/or exterior of the magnet to change the magnetic field, additions of smaller pieces of magnetic material to cause localized increases or decreases in field strength, and large-scale distortions of the magnet structure are all examples of mechanical methods for improving the field homogeneity of magnets. This list of mechanical methods is not exhaustive. For example, magnets may be disassembled and then reassembled with new thin pieces or "shims" incorporated so that the relative positions of the magnet's constituents are altered, changing the shape of the magnetic field. Older examples of past efforts to adjust, with mechanical shimming, a magnetic field include U.S. Pat. No. 4,631,481 to Young et al., U.S. Pat. No. 5,235,284 to Tahara et al., U.S. Pat. No. 5,343,183 to Shimada et al., and U.S. Pat. No. 6,313,634 to Kasten.

Non-mechanical methods are likewise possible. The non-mechanical methods often have the attractive characteristic of continuous adjustability, ease of adjustment, and ease of automation. One very common non-mechanical method utilizes wires that carry electrical current. Such currents create magnetic fields around the wires. These fields are strongest near the wires and have a spatial distribution of strength and orientation that can be calculated from known physical principles. The wires sometimes are configured as coils, and are placed more or less proximate to the magnetic field to be corrected. By carefully adjusting the currents in such wires, the homogeneity of the "target" or original magnetic field can be increased, because the magnetic fields generated by the wire currents can counteract some, or most, of the inhomogeneities present in the field of the original magnet. By analogy with the thin sheets or strips of metal (e.g., shim stock) that have sometimes been used to mechanically adjust magnets, these coils of wire have come to be known as "shims" or "shim coils." Because the individual coils of wire used to correct the original magnetic field typically create non-uniform fields, they are also sometimes referred to as "gradients" or "gradient coils." Other names may be employed. An example of a relatively recent disclosure in the field of electronic wire coil shims is U.S. Patent Application Publication No. 2011/0137589 by Leskowitz et al., the entire disclosure of which is incorporated herein by reference by way of background.

Non-mechanical methods may be used in conjunction with one or more of the mechanical methods. Mechanical adjustments are often used to correct the inhomogeneities that are large in amplitude or extend over a large length-scale, with non-mechanical adjustments used for fine correction of the residual field defects.

SUMMARY OF THE INVENTION

There is disclosed hereby an innovative design for a shim coil system. As disclosed herein, the layout of the wires of the coils is dramatically simplified in a way that preserves the working space inside the original magnets. In the presently disclosed apparatus and method, no attempt is made to produce particular shapes of correction fields or terms via the careful layout of the wires. The current paths are directed in a plurality of orientations, and do not require cross-over points. Many individual current paths may occupy a single layer in the shim coil structure. The complexity of the shim system is removed from the coils, which may need to be placed in a very space-limited location, and transferred to the current controlling electronics and software, which are not constrained by the target magnet.

Groups of parallel shim coil wires are, in preferred embodiments, arranged such that the wire groups have axes with different directional orientations. By overlapping two or more shim wire groups with differently oriented axial directions, a compact shimming apparatus is provided for generating a controllable corrective magnetic field for adjusting a main original field, such as to enhance the uniformity or homogeneity of the main field.

Although its design promotes physical compactness, the disclosed shim coil design may nevertheless be useful in cases where space inside the magnet is not limited. It may be used for magnets made from permanent magnet technology, superconducting magnet technology, electromagnet technology or other magnet technologies. It may be useful for devices that utilize the Earth's magnetic field. It may also be used to create the magnetic field itself, without the use of a separate, original, source for the field. It may be used in devices without external magnets. It may be useful for magnets that are designed to create a particular form of field distribution rather than a uniform field. It may be used with unilateral or single-sided magnets.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF A PREFERRED EMBODIMENT

Figure 1:
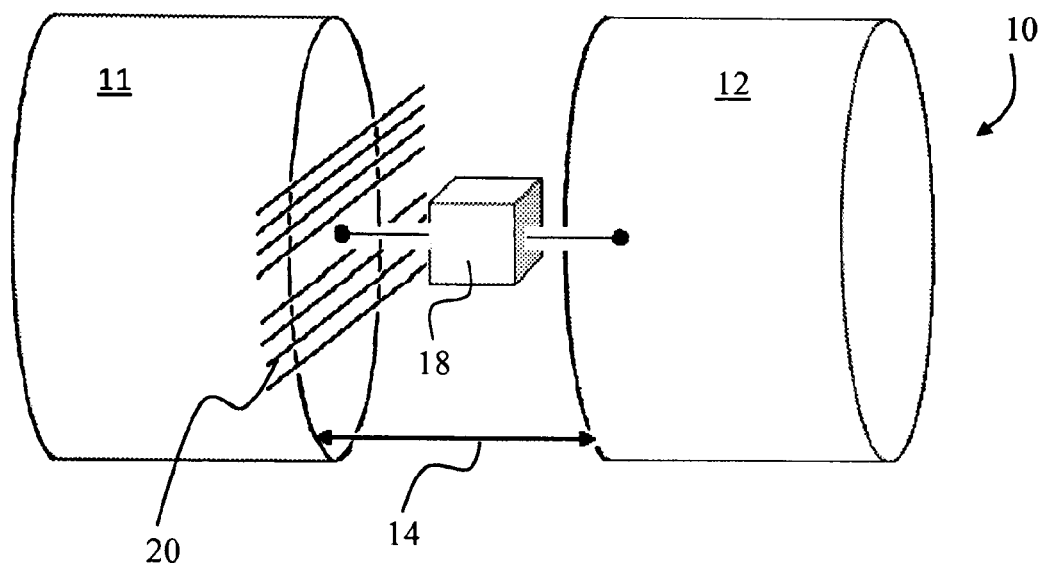
FIG. 1 is side view diagram, in mild perspective, of an a system according to the present disclosure, including a shim coil in position relative to a magnet.

Uniform magnetic fields are desirable for numerous scientific, industrial, educational, and other fields of endeavor. It is desirable, therefore, to provide means and methods for adjusting an original magnetic field to improve its homogeneity. A field of use where magnetic field adjustments are commonly employed to improve the magnetic field quality is nuclear magnetic resonance (NMR). In NMR, a uniform magnetic field is required to enable the phenomenon of resonance. The resonance condition is manifested by an interaction between the nuclear magnetic moment of the atoms making up a substance and an external oscillating magnetic field. When such an oscillating field is applied to the substance, typically in a short burst or pulse, the nuclei of the substance can be excited from their lowest energy state. These nuclei can emit electromagnetic signals as they return to lower energy states. The frequencies of the electromagnetic signals emitted by the nuclei are directly proportional to the strength of the magnetic field at each individual nucleus. The frequency content of the emitted signals can contain information useful for scientific and industrial analysis. The quality of the information, including the strength of the signal, the information content, resolution, and other properties, is often improved if the magnetic field is more homogeneous.

A non-pulsed or "continuous wave" version of an NMR experiment or measurement may be implemented. Hybrid techniques making use of ideas from both pulsed and continuous wave NMR are also possible. Any of these NMR methods or devices may benefit from improvements to the field homogeneity of the magnets they employ. NMR measurements may also be made in conjunction with magnetic field gradients in order to perform Magnetic Resonance Imaging As mentioned above, shim coils may be deployed to adjust/correct the uniformity of a target field. The design of the wire positions for shim coils determines the strength and shape of the magnetic correction fields they create. Usually, more than one shim coil is used to enhance the flexibility or adjustability of the shim system. When more than one shim coil is used, it is advantageous to design the coils so that they are nominally independent, or "orthogonal," over the anticipated sample volume. A way to achieve this independence is to provide a set of shim coils so that each coil creates a magnetic field that closely approximates a mathematical function that is mathematically orthogonal to the functions corresponding to the other coils in the shim set. Sets of special functions known in mathematics, such as the known "spherical harmonics" functions, can be used for this purpose, in which each shim coil is designed to produce a field that approximates one of the functions in the set. For example, coils may be made to approximate the $Y_{10}$, $Y_{1-1}+Y_{11}$, $Y_{1-1}-Y_{11}$, $Y_{20}$, (and so forth) "terms" of the set of spherical harmonics. As another example, coils may be constructed to produce shim fields labeled X, Y, Z, $Z^2-Y^2$, etc. In the language of mathematical expansions or approximations, each of these shim fields may be considered an independent "term" of the magnetic field inhomogeneity, and there are many ways to build sets of shim coils that correspond to various sets of mathematical terms.

One benefit of shim coils designed to produce independent correction terms is that the adjustments to their currents can also be independent, e.g., the currents in the coils can be adjusted sequentially, with adjustments that optimize the current in each coil not altering the optimal setting of the other coils. This ideal is usually not fully achieved in "real" shim coil sets; readjustments of the previously-optimized currents are usually required. Complicated, iterative algorithms are frequently utilized to achieve the best overall setting of the currents in the shim set. Care taken to design and build orthogonal coil sets can reduce this complication.

It may also be necessary to adjust the currents in the shim coils whenever something in the device or experiment changes. Such changes include the insertion or injection of a new sample or new substance, the movement of the NMR detection coil to a new region in the magnet, a change in temperature, a change in sample size, chemical physical or biological changes in the sample, or any other change or alteration capable of changing the magnetic field in the region of the sample.

Shim coils are often made with single wires, or segments of wires, connected to form a signal current path. Another construction method is to use printed circuit board techniques, including flexible PCB techniques, to define the current path for each shim term. With this kind of approach, the contribution of a particular shim term to the overall field correction is controlled by a current source dedicated solely the associated, particular, shim coil. To produce highly homogeneous fields, it may be necessary to include a large number of shim terms. The "low-order" terms typically correct the large-scale variations in the magnetic field, while the "high-order" terms correct the finer scale variations. To have a full set of high order corrections, a large number of terms must be included. Thus, achieving the desired magnetic field homogeneity may require a large number of shim coils.

Modern methods for designing and utilizing shim systems for NMR devices sometimes utilize coils that may not individually create the desired shim terms. Instead, linear combinations of coil correction fields create the individual mathematical terms. For example, when the user or computer requests an adjustment to the setting of the "$Z^2-Y^2$" shim, the currents on many of the coil wires are independently changed to achieve the desired effect. Each shim "term" is implemented by its own unique combination of currents on the various shim coils. One way to implement the control algorithm that maps the adjustments requested on an individual mathematical shim term to the currents that flow on the individual shim coils is via a matrix that converts the multiple shim term "requested values" to the multitude of "required currents." Hence, such modern field adjustment systems are called "matrix shims." The matrix approach allows the approximation to the mathematical terms to be improved. One improvement is that the orthogonality of the shims can be made more exact, so that the process of optimizing the currents can be simpler and faster.

In all the foregoing, of course, efficient computer hardware, and software algorithms within the known computer programming arts, are invaluable for implementing efficient shim coil performance.

The coil layouts for matrix shims typically are designed so that the coils can efficiently produce the usual mathematical correction terms. It is beneficial if the layout of the coils is such that simple linear combinations of currents in only a few of the wires are needed to create the desired terms. To produce high-quality, high-order corrections to the magnetic field, a large number of individual matrix shim coils may be required.

The current paths used to create known shim systems, either standard or matrix shims, are closed loops. The loops in known systems may require that the current path cross over itself, due to the coil having multiple turns, or having a set of separate loops centered at separate locations, the need to provide leads to connect the coil to the current source, or other reasons. Wire or PCB trace cross-overs may increase the thickness of the space occupied by the set of shim coils.

One trend in NMR instrumentation is miniaturization of the apparatus, including the magnet. For many industrial applications of NMR, it would be helpful to have a very small, very homogeneous permanent magnet to provide the required magnetic field. For example, a magnet with a 5 mm wide working volume can have useful NMR performance levels. As the NMR magnets become smaller, the mechanical tolerances that must be met to achieve high field homogeneity become very difficult to achieve. Shim coils are necessary to achieve high spectral resolution and/or high signal sensitivity. For miniaturized magnets, the space available for the shim coils may be severely limited. It may be difficult to install the large number of shim coils needed to achieve high order magnetic field correction without filling the working volume or sample region of the magnet, and thus leaving insufficient room for the sample. As an example, an original magnet with a 5 mm space between its pole faces (a 5.0 mm "magnet gap") may allow the use of first- and second-order shim sets when these consist of two PCBs, each of 1 mm thickness. Such a configuration leaves 3 mm of useable space available for the sample and its associated mechanical support structures and detection coil. Adding third and fourth order shims using the sample PCB technology may triple the thickness of the shim coils to a total of 6 mm which would not fit into the 5 mm magnet gap of this example.

Moreover, it may be desirable to maximize the size of the sample. This may be because the sample itself is intrinsically large, or that a large amount of sample material is needed to achieve adequate signal levels, or that the chemical, physical, or biological phenomenon under NMR study requires a large volume sample, or that existing devices and methods utilize sample paths and volumes that determine the required sample size, or any other reason. A large sample can be accommodated in a small magnet only if sufficient volume inside the magnet is left open. A bulky set of shim coils does not allow for the maximum sample size. On the other hand, achieving high homogeneity over the entire volume of a large sample requires a high degree of shimming. That is, the creation of numerous high order shim terms may be required. This can be done only with a shim set that contains the large number of coils needed to create the many terms.

The foregoing are examples of some of the contradictory requirements for the spectroscopic study of large samples in small magnets. The systems of the present disclosure address the contradictions.

The presently disclosed invention addresses the foregoing requirements by providing a new design for shim coils. According to the present disclosure, the coil wire layout is dramatically simplified in a manner that preserves the working space inside the original magnet. The present methods and apparatuses, do not aspire to produce particular shapes of correction fields or terms via the careful layout of the shim coil wires. The current paths do not require cross-over points. Many individual coils may occupy a single layer in the shim coil structure. The task of creating the desired correction fields is instead advantageously transferred to a current controller. The complexity of the shim system is taken out of the coils, which may need to be placed in a very space-limited location, and transferred to the current controlling electronics and software, which are not constrained by the magnet. Of course, the present new shim coil design may also be useful in cases where space inside the magnet is not severely limited.

The present system may be used for magnets made from permanent magnet technology, superconducting magnet technology, electromagnet technology or other magnet technologies. It may be useful for devices that utilize the Earth's magnetic field. It may also be used to create the magnetic field itself, without the use of a separate source for the field. It may be used in devices without external magnets. It may be useful for magnets that are designed to create a particular form of field distribution rather than a uniform field. It may be used with unilateral or single-sided magnets.

One of the many applications of the present invention is the improvement of the homogeneity of dipolar magnets with north and south poles that define a magnet gap. In a preferred embodiment, the system's shim coils consist of many grouped, straight, parallel wires. A ribbon cable thus could be used as a model for such an embodiment.

FIG. 1 is a simple perspective diagrammatic view of a basic embodiment of a system according to the present disclosure, as it might be used including an original magnet such as the main magnet of an NMR system. Portions of two cylindrical pole pieces (north pole 11 and south pole 12) of the original magnet 10 are shown. The poles face each other and define the magnet gap 14. The sample (not shown) to be evaluated by NMR is to be placed in a generally central region 18 of the magnet gap 14. (The central or sample region 18 is within the working volume of the NMR system.) The shim coil wires 20 are used to improve the magnet's field homogeneity in this central sample region 18. In FIG. 1, for illustrative simplicity, wires in one direction only are shown, and only on one side (north pole 11) of the magnet gap 14. Eight parallel, equally-spaced, straight wires 20 are shown, although (as will be discussed further herein) other numbers and configurations of wires are possible without departing from the scope of the invention.

While a dipole magnet 10 is shown in the figures, it is to be understood that the original magnet whose field is to be adjusted may, in adapted versions of this system, be any of a variety of permanent magnets, electromagnets, or superconducting magnets. The magnet 10 in other alternative embodiments of the system may be a single-sided magnet or a Halbach magnet. The magnet 10 may even be the Earth itself, and the magnetic field to be adjusted is the earth's magnetic field. In most applications of the system, the magnet 10 is adapted deliberately to generate a substantially uniform field. Still, in alternative applications the magnet 10 may adapted to generate an intentionally non-uniform field, so that its magnetic field is substantially not uniformly distributed.

Figure 2:
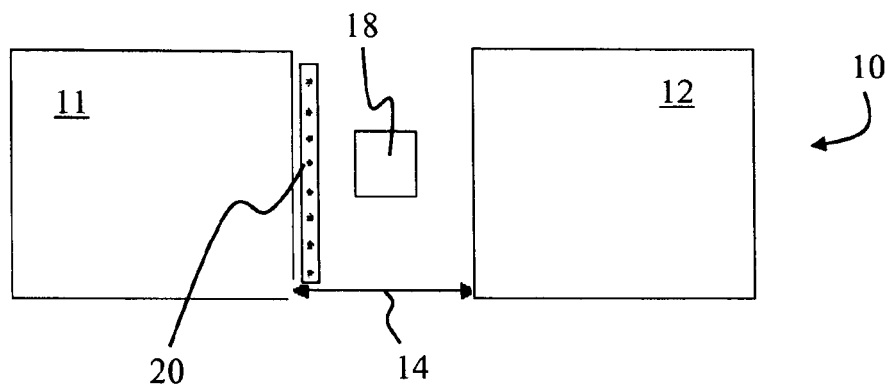
FIG. 2 is a diagrammatic side view of the apparatus system seen in FIG. 1.

FIG. 2 is a side view of the simple system seen in FIG. 1. The cylindrical pole pieces 11, 12 now appear in cross section as rectangles. As in FIG. 1, only a single set of eight parallel wires 20 is shown (end-on) and only on one side (north pole) of the magnet gap 14.

Figure 3:
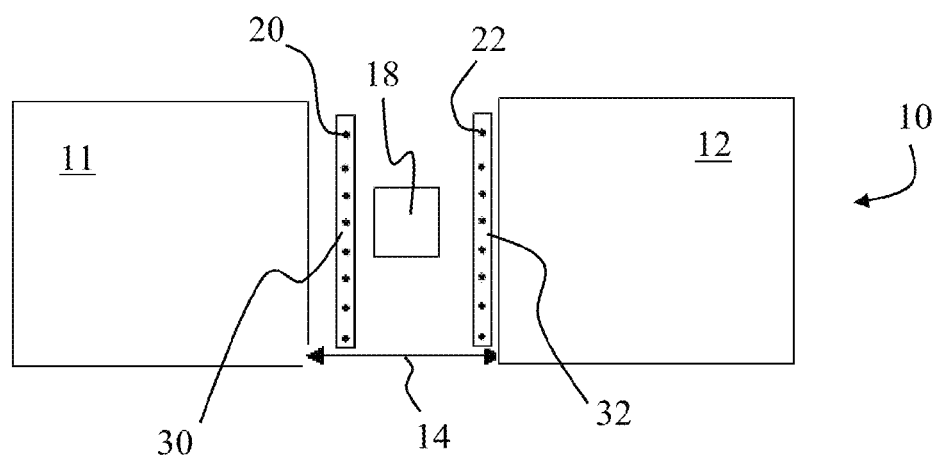
FIG. 3 is a diagrammatic side view of a system similar to the embodiment shown in FIG. 2, but with shim coil wires indicated on both sides of the magnet gap.

FIG. 3 more fully depicts a simple preferred embodiment. FIG. 3 shows a side view similar to that of FIG. 2, but with wires 20, 22 indicated on both sides of the magnet gap 14. The components 30, 32, including the wires and their supporting materials, which define the shims on either side of the magnet gap 14, are sometimes called "shim paddles." In FIG. 3, the straight wire shims on both sides of the gap 14 only show wires 20, 22 going "into" the page. In an actual embodiment, wires in more directions will be present on either side of the magnet gap 14.

FIGS. 4-14, discussed in detail hereinafter, provide details regarding various embodiments of shim configurations and shim wire groupings. Such shim wire groupings and arrangements according to the present disclosure may be adapted, customized, and deployed singularly or in plural collections, for use in a magnet gap 14 of a magnet 10 generally in accordance with a system such as that illustrated simply in FIG. 2.

Figure 4:
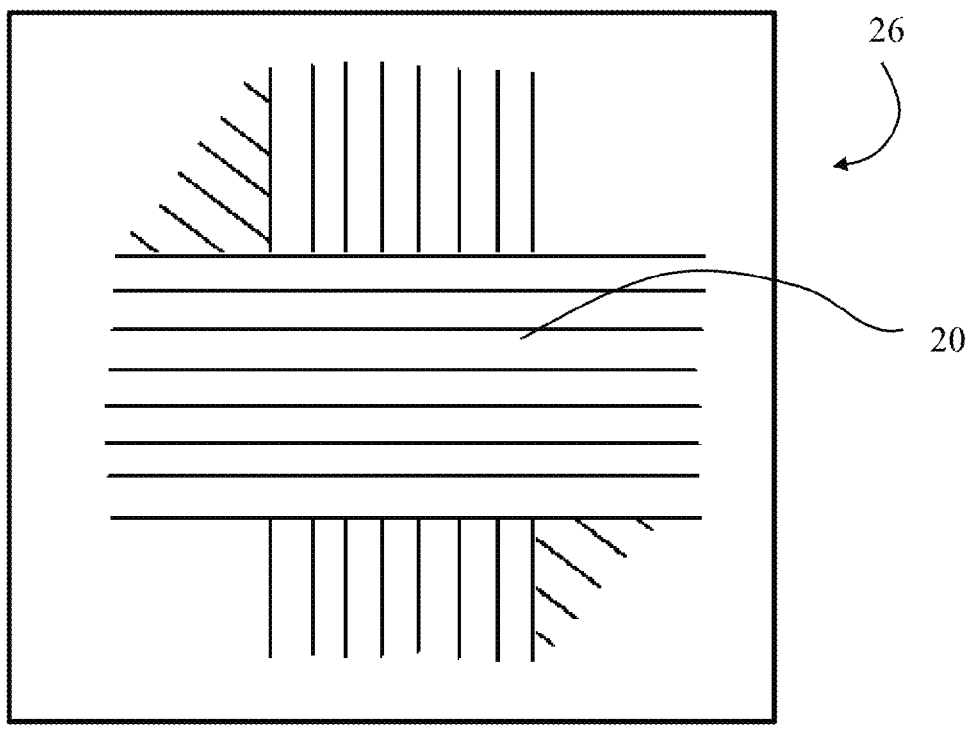
FIG. 4 is a plan view of a shim arrangement useable within an embodiment of the system according to the present disclosure, the shim having four groups of eight wires situated in four directional orientations.

For example, FIG. 4 shows a shim arrangement 26 with wires 20 in distinct directions or spatial orientations. The plurality of orientations (spatially in two or three dimensions) are different from each other. The wires 20 of FIG. 4 are, by way of example, arranged in four groups of eight wires per group. This may be the distribution of wires in either or both of the shim paddles 30, 32 in the preferred embodiment, and is capable of producing all the shim fields of the first and second order. The wires 20 are also useful for creating the shim fields of higher order. The wires 20 in the four directions seen in the arrangement 26 of FIG. 4 preferably are disposed to lie in separate layers in relation in the direction normal to the page of FIG. 4; that is, they are "stacked" one "above" another in an overlapping fashion with a modest separation distance between layers. For example, these wires 20 may be in four different layers of a printed circuit board (PCB) or other substrate structure. In a preferred embodiment, four-layer substrate structures are placed on either side of the magnet gap 14, oriented in a symmetric fashion with respect to each other, as shown edge-on in FIG. 3. This shim coil configuration requires only four layers of wires or circuit board traces. In contrast, a traditional design known in the art, for a complete first- and second-order shim set, typically requires at least eight layers, and may require more to accommodate the connections and cross-overs for each individual coil.

Figure 5:
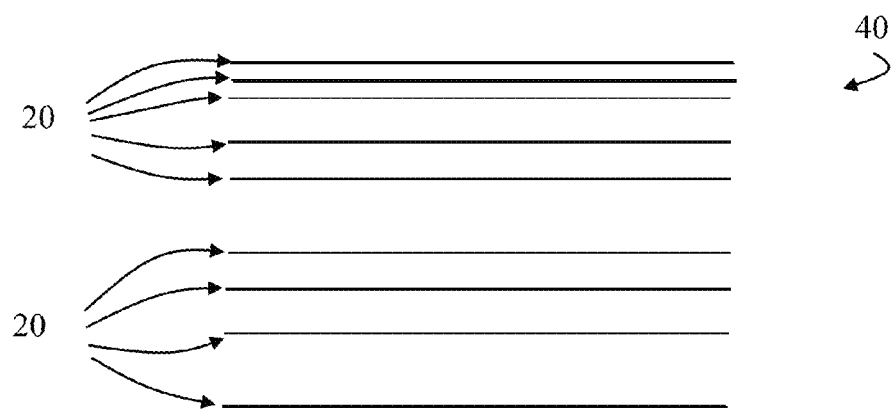
FIG. 5 is a plan view of a shim arrangement useable within an alternative embodiment of the system according to the present disclosure, the shim having a group of wires disposed with non-uniform spacing.

In the drawing figures discussed herein above, straight wires 20, in groups of eight, evenly spaced, have formed the building blocks of the multi-order shim sets. However, there is no requirement that a group of wires consists of eight wires, or that the wire spacing be even. Any number of wires may be used in a group, for example two, three, four, five, six or more wires, without departing from the scope and spirit of the invention. The upper limit of number of wires may be fixed by the size of the wires, and/or the complexity that can be tolerated in the current control electronics and software. FIG. 5 illustrates, for example, a simple wire group 40 having nine wires 20 in the group, which are parallel but necessarily evenly spaced. As discussed further hereinafter, each wire group 40 in any embodiment of the presently disclosed system thus preferably, but not absolutely necessarily, includes at least four wires 20 (but potentially many more, ranging up to by way of example only, approximately 32) disposed in at least one layer in a substrate structure.

The parallel wires in a group preferably are separated by equal spacing distances between adjacent wires, but this is not a requirement. FIG. 5, for instance, illustrates a wire arrangement in which the spacing between wires 20 in a wire group 40 is non-uniform. There may be reasons to prefer such an arrangement under certain circumstances. There may also be reasons for preferring that the multilayer shim paddles 30, 32 (FIG. 3) not be identical to each other, rather, that a different shim configuration be provided on either side of the magnet gap 14. Also, there may be reasons to have the shim paddles 30, 32 not share a common orientation. Further, there may be reasons to prefer to use only one multilayer shim on one side of the sample space 18, or to use more than two sets of multilayer shims.

The current on each of the wires may be controlled individually by controllable current source(s) of any suitable design known in the art. For example, the current sources may have current detection elements in their feedback loops so that constant current is maintained. The current sources may be controlled by a voltage signal, such as in transconductance amplifiers. The current sources may also be configured as voltage sources without current detection in their feedback loops. The current controller may produce currents that may be pulsed on or off, or switched between otherwise constant values, or have a defined function of current versus time, as may be advantageous for the particular measurement to be performed. Connections between the wires and the output of the controlled current source(s) may be by any means known in the art.

The return paths for the current may be designed and constructed in any of a number of ways, as is convenient for the system builder, compatible with any particular application, and/or consistent with their performance as field homogenizing devices. For example, the wires may each individually be extended so that they return to their individual current sources and complete the electrical circuit. Such extensions may be via a path that exits the magnet gap and returns to the current source by following a path lying outside of the magnet body. Or the extension may be back through the magnet body along such a path that it does not alter substantially the magnetic field in the sample region. Groups of shim coil wires may be connected on the side of the gap remote from their current sources, and each such group may be reconnected to a common point shared between all of their current sources. This reconnection path may be around the body of the magnet, or back through the magnet body. All of the wires may be connected together in this fashion, and then connected by a single wire to a point electrically common between all of the current sources. Some wires may be connected in groups, while others are returned to their current source as individual independent wires. Some of the current may return to the current sources via the interior of the magnet while some of the current may return via the exterior. The magnet structure itself may provide a portion of the current return pathway. The system may be designed so that the wires in any one direction are all connected together at the side of the gap remote from their current sources. No connection back to the current sources may be needed if the net algebraic current flowing in any one direction is zero. The currents required to produce any one shim term may be calculated so that the net zero current condition is met. In this case, and as discussed further hereinafter, the wires in a direction may be connected individually to the current sources on their respective first ends and connected to a common connection or set of shared connections on their other ends, and this common connection or set of common connections may be connected back to the current source to form a common current return path for the wires so connected.

Wires that are not strictly straight may also be used in alternative embodiments. The advantage of small shim system size is preserved if none of the wires in the nominally common direction cross. Wires following non-straight paths, such as zig-zags, waves, or other paths may be used. The wires in an individual shim paddle layer preferably all have the same shape. In a preferred embodiment, though, the wires in any individual layer of the shim paddle do not cross each other. Wires in different shim paddles may have different non-straight shapes.

Shim paddles may be constructed using PCB techniques known in the art. The PCB traces may have different widths and thicknesses in the different layers of the shim paddle. The traces in any one layer may have different widths. The shims may also be constructed from individual wires. The wires may be laid out in the desired pattern and then held in place using adhesives or glues, or by mechanical means, such as by clamping, or other suitable means. Wires of different diameters may be used in the different layers. Wires of different diameters may be used in an individual layer.

Figure 6A:
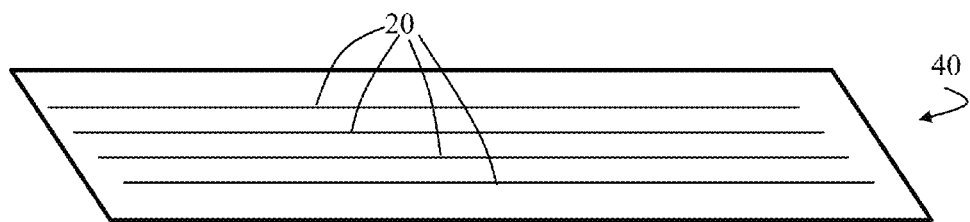
FIGS. 6A-C are perspective views of three possible and exemplary shim wire groups in accordance with this disclosure, there being four wires in the group of FIG. 6A, five wires in the group of FIG. 6B, and 32 wires in the group of FIG. 6C.
Figure 6B:
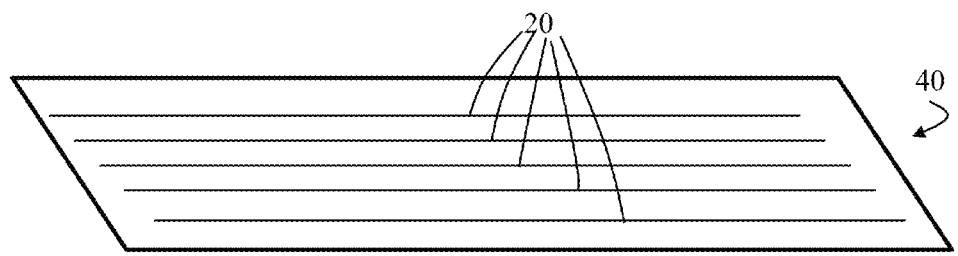
Figure 6C:
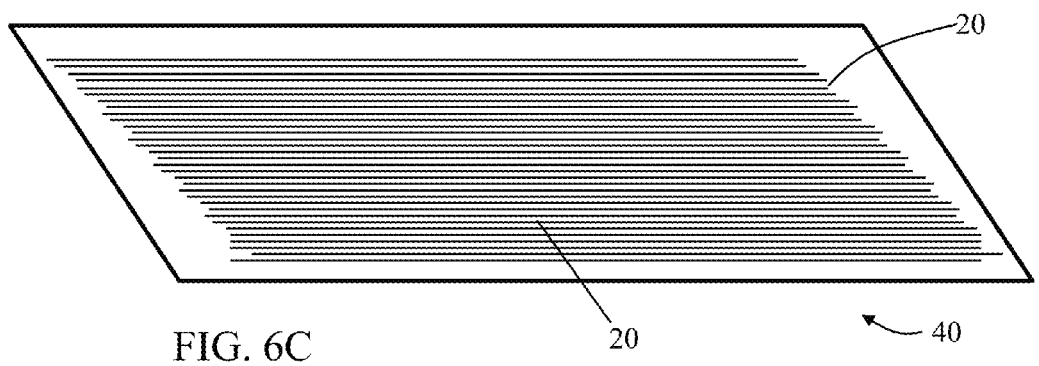

FIGS. 6A-C illustrate that the number of wires 20 in a particular group 40, for use in a shim paddle 30, can be selected from a wide range. FIG. 6 shows a group of four parallel wires 20 in a group, as may be within a layer of a substrate structure of a shim paddle. As a practical matter, four wires, as seen in FIG. 6A, may be the practical lower limit for the number of wires 20 in a given group, as fewer than four wires in a single group 40 generate a largely ineffective field. A group of five wires 20, as seen in FIG. 6B, may be helpful in certain applications. FIG. 6C shows a group of 32 wires 20, and 32 may be the approximate practical upper limit for the number of wires in a given wire layer group 40. Nevertheless, in a preferred embodiment the number of wires 20 in a group is at least four; more preferably, the number of wires 20 per a wire group is in the range of from at least four to approximately 32.

Notably, the wires 20 in any given wire group 40 may be spaced laterally one from another by uniform separation distances, as suggested by FIGS. 6A-C. Alternatively, the wires 20 in a group 40 may be spaced one from another by non-uniform separation distances, such as the wires 20 seen in FIG. 7A.

Figure 7A:
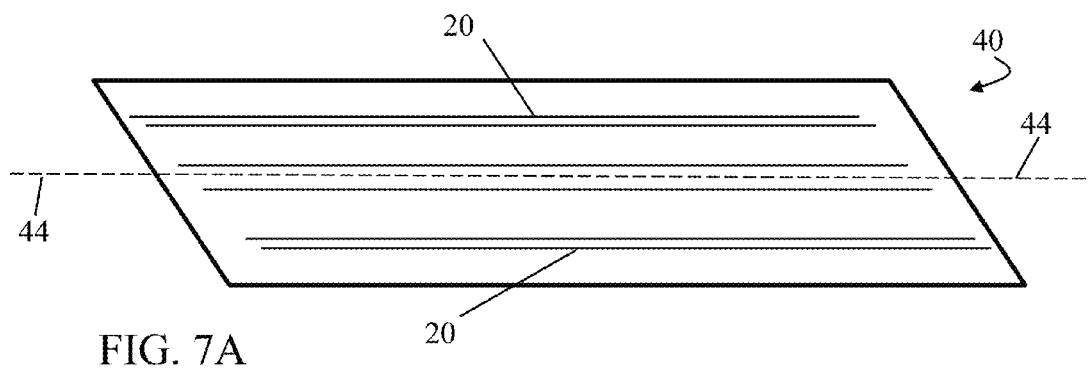
FIG. 7A is a perspective views of a possible exemplary shim wire group in accordance with this disclosure, there being six wires in the group, arranged generally symmetrically about the principal axis of the group.
Figure 7B:
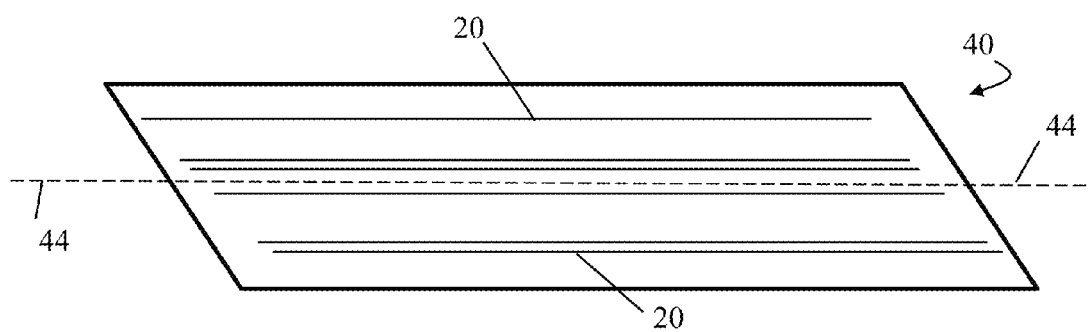
FIG. 7B is a perspective views of another possible exemplary shim wire group in accordance with this disclosure, there being six wires in the group, arranged generally asymmetrically about the principal axis of the group.

Attention is invited to FIGS. 7A and 7B. To manipulate a subject magnetic field in certain selected ways, it may be desirable to provide that the wires 20 in a group 40 be separated from each other by non-uniform spaces or gaps, or be placed asymmetrically within their given layer. It is seen in FIG. 7A, for example, that a group 40 of wires 20 may be arranged in a generally planar layer, such as a layer in a substrate structure, in an array aligned about an imaginary central axis 44. The wires 20 are mutually parallel and parallel to the central axis 44, and, as seen in FIG. 7A, may be arrayed substantially symmetrically around the central axis, yet with non-uniform spacing between individual wires. Alternatively, and as seen in FIG. 7B, the wires 20 in a group 40 may be arranged in a generally planar layer, such as a layer in a substrate structure, also aligned about an imaginary central axis 44. The wires are mutually parallel and parallel to the central axis, but, as seen in FIG. 7B, are arranged asymmetrically around the central axis and with non-uniform spacing between individual wires.

Figure 8:
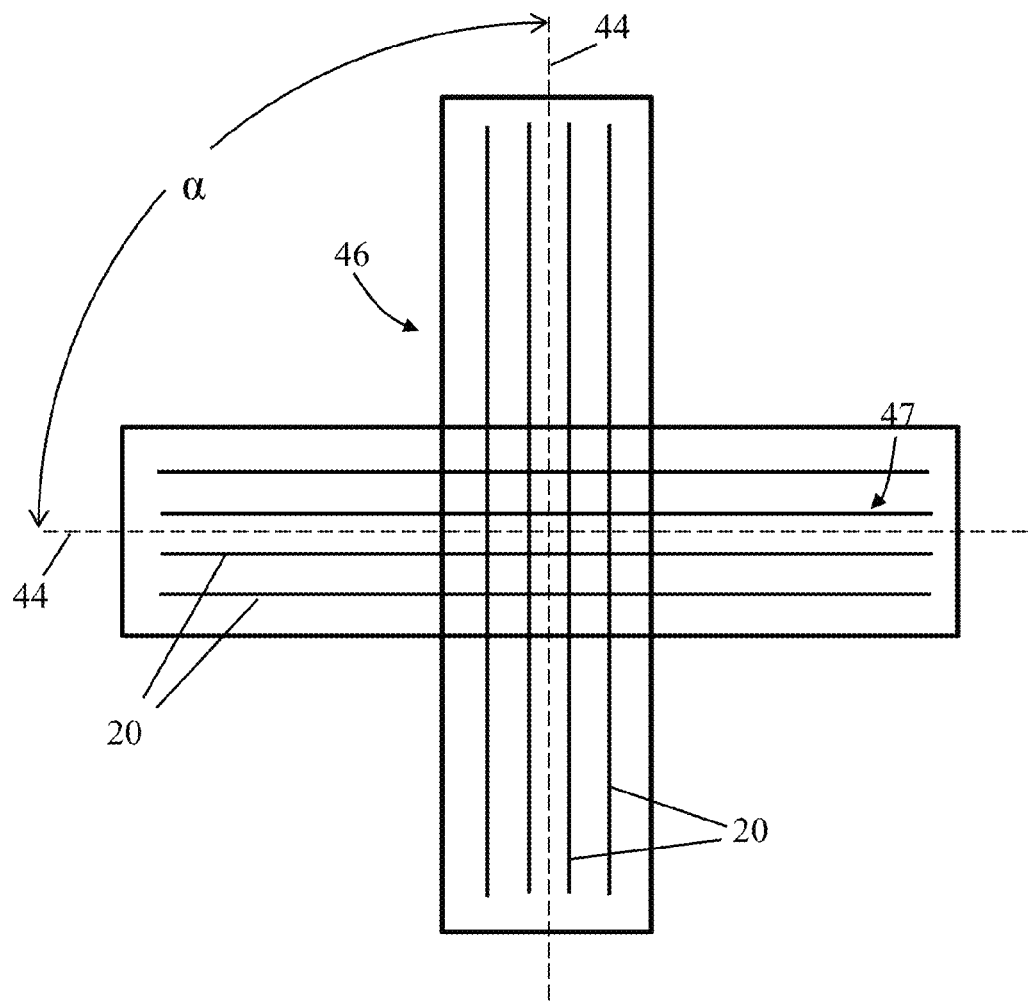
FIG. 8 is a plan view of a collection of two shim wire groups according to the present disclosure, there being four wires in each of two overlapping groups and the groups being arranged with their axes defining an included angle.
Figure 9:
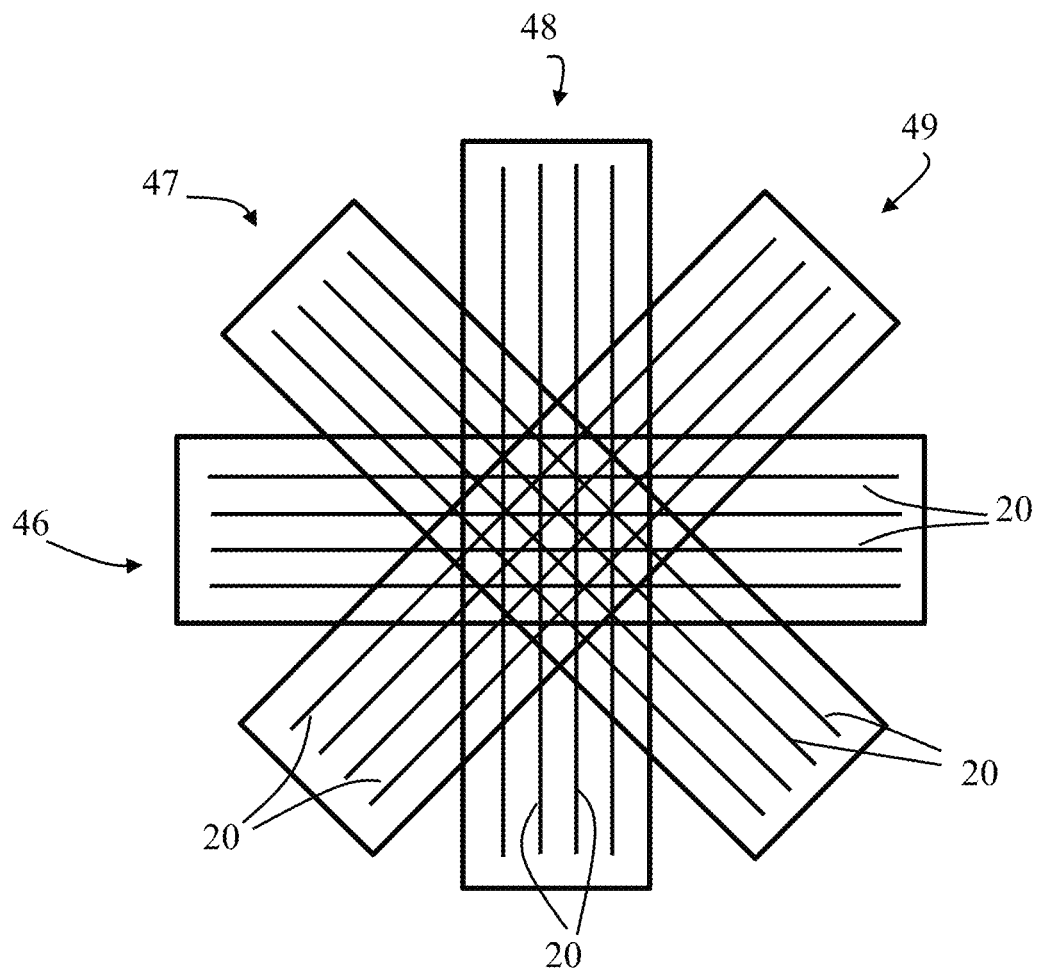
FIG. 9 is a plan view of a collection of four shim wire groups according to the present disclosure, there being four wires in each of four overlapping groups and the groups being arranged with their respective axes defining approximately uniform included angles.

Besides being permissive of a wide range of numbers of wires per group of wires, and of a variety of arrangements and arrays of wires in a group, the inventive systems and methods also accommodate a generous range of numbers of groups and numbers and types of orientations between/among associated wire groups. "Orientation" refers to a directional vector, associated with the principal axis of a wire group, in three-dimensional space. Perhaps the simplest number and configuration of associated wire groups is depicted in FIG. 8. Two groups 46, 47 of wires 20 (four wires per group seen, by way only of non-limiting example, in the figure) are disposed in an overlapped generally symmetrical cross. The axis of the first group 46 defines an angle of approximately 90° with the axis of the second group 47. FIG. 9 shows a preferred arrangement of four groups 46, 47, 48, 49 of wires 20 (again, with four wires per group), also arranged in an overlapping symmetric cross. The respective axes of the groups 46-49 are angularly separated uniformly by 45°; thus, the axis of a first wire group 46 defines an angle of approximately 45° with the axis of a second wire group 47, whose axis in turn defines an angle of approximately 45° with the axis of a third wire group 48, and so on. It has been determined that the number of groups of wires in an associated collection of wire groups preferably is an even number, although a collection of three groups, or some other odd integer number of wire groups, may generate a field that is useful for certain applications.

Figure 10:
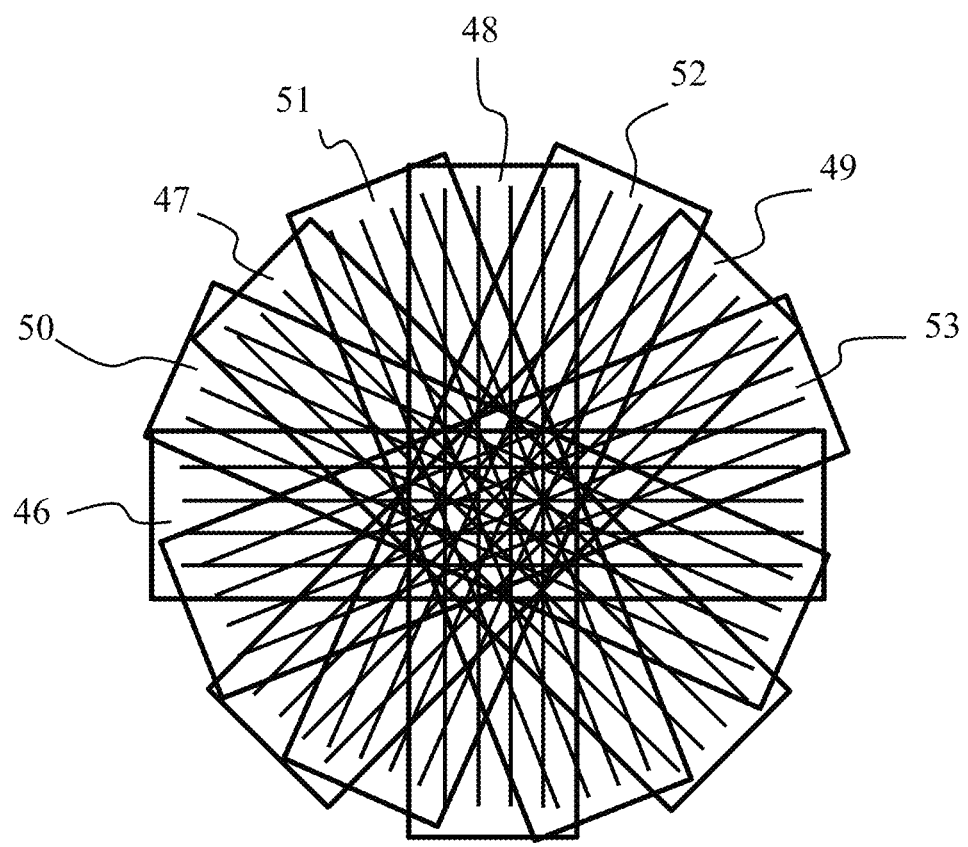
FIG. 10 is a plan view of a collection of eight shim wire groups according to the present disclosure, there being four wires in each of eight overlapping groups and the groups being arranged with their respective axes defining approximately uniform included angles.

There is no fixed theoretical limit to the number of wire groups for a shim paddle that may be within the scope of the invention. For instance, a non-limiting example is seen in FIG. 10, an embodiment featuring eight groups of wires 46, 47, 48, 49, 50, 51, 52, 53 (again, four wires per group by way of example), arrayed in an angularly symmetric cross. However, it is contemplated that for most applications, the number of wire groups, N, associated in a structure preferably is between two (2) and eight (8), and more preferably is selected from the group of integers consisting of four (4), six (6), and eight (8). It is seen that the apparent density of overlapped wires 20 near the center of the arrangement of FIG. 10 is high, allowing for the generation of more precisely defined corrective field(s). More than eight wire groups (preferably, but not absolutely necessarily, arranged in a pattern similar to FIG. 10) may be required for high order (i.e., very high precision) correction or production of magnetic fields.

A descriptive pattern for configurations of the present system is evident from the illustrations of FIGS. 8-11. There is a correlation between the number of wire groups 40 in a substrate structure and an angular relationship between those groups. It is observed that in preferred embodiments, each substrate structure (e.g., structures 58-60) mounts N groups of substantially straight parallel wires, N being the integer number of groups (greater than one, because any substrate structure, and thus any shim, preferably has two or more groups 40 of parallel wires 20). In the preferred wire group configurations, such as the groups arranged in the plurality of orientations in relation to each other to define the cross-like array seen in FIGS. 8-11, the central longitudinal axis of any one group 40 of wires defines an angle α of approximately 180°/N with the central longitudinal axis of a second wire group most closely aligned with the one group. Here, "most closely aligned" groups ordinarily refers to two angularly adjacent wire groups whose central axes are skewed by the least size included angle. The relationship is most readily depicted in FIG. 8, in which the number N of wire groups 46, 47 is two. The respective longitudinal central axes 44, 44' of the groups 46, 47 define the angle α which equals 180/2, or 90°. This relationship extends to a larger number of wire groups (e.g. groups 46-53 of FIG. 10) arranged so to have their respective longitudinal central axes intersecting (typically perpendicularly) a single common imaginary line.

Figure 11:
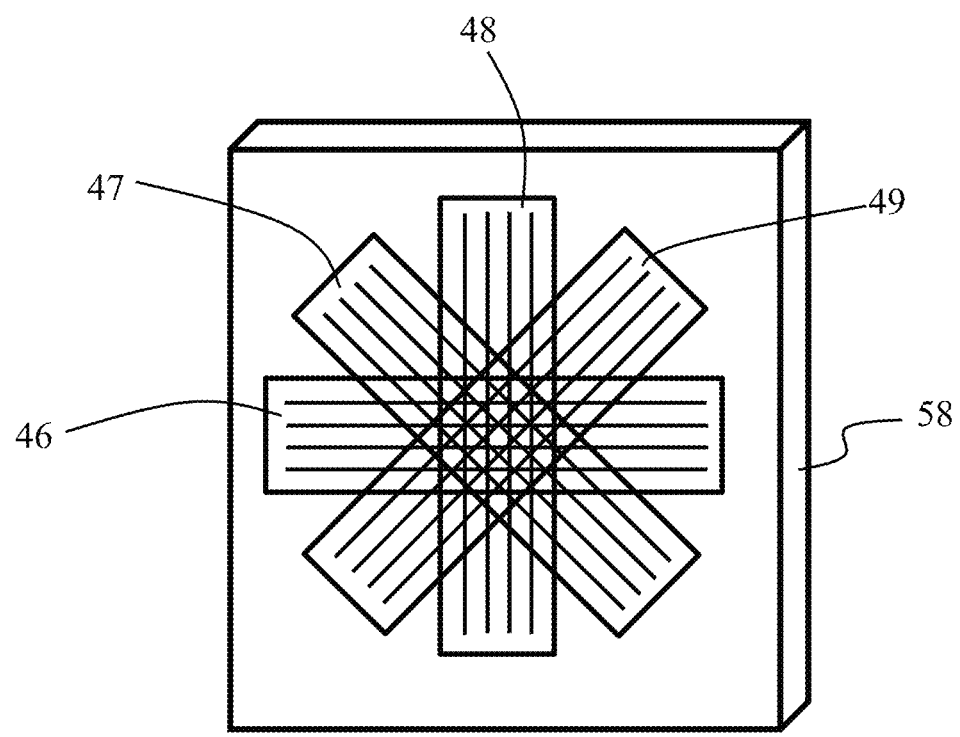
FIG. 11 is a mildly perspective view of a shim component useable in the system of the present disclosure, with a collection of wire groups substantially similar to those of FIG. 9, mounted on or in a tile-shaped substrate structure.

Wire groups preferably are mounted on and/or in a substrate structure to provide a shim paddle. For example, as seen in FIG. 11, there is provided a single, substantially planar substrate structure 58 mounting four groups 46-49 of parallel wires. Each wire group may for convenient fabrication be disposed in a separate layer within (and/or on) the substrate structure 58, with one wire group per layer. Alternatively, a particular group 46, 47, 48, or 49 may occupy more than one layer, e.g., two adjacent layers, of a substrate structure 58.

Figure 12:
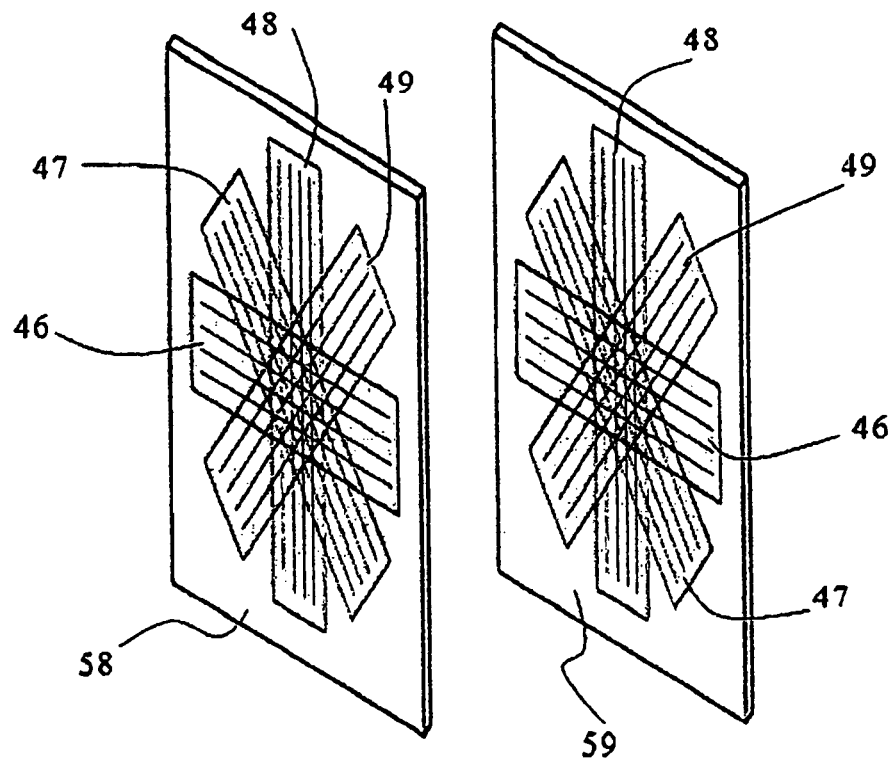
FIG. 12 is a mildly perspective view of two components similar to the component seen in FIG. 11, the two components in a parallel, optionally partially overlapping, proximate relation.

More sophisticated corrective field generation may be provided by deploying two or more substrate structures mounting wire groups. FIG. 12 illustrates two substrate structures 58, 59, each mounting (by way of example) four groups 46-49 of parallel wires. The substrate structures 58, 59 are substantially planar, and are situated generally mutually parallel and in confronting positions facing each other; such a location relationship between two substrate structures 58, 59 would be quite typical for use within, for example, the gap 14 of a NMR magnet 10. The respective sizes, and spacing distance of separation, between the structures 58, 59 is selected based on the circumstances and objectives of a particular application.

Figure 13:
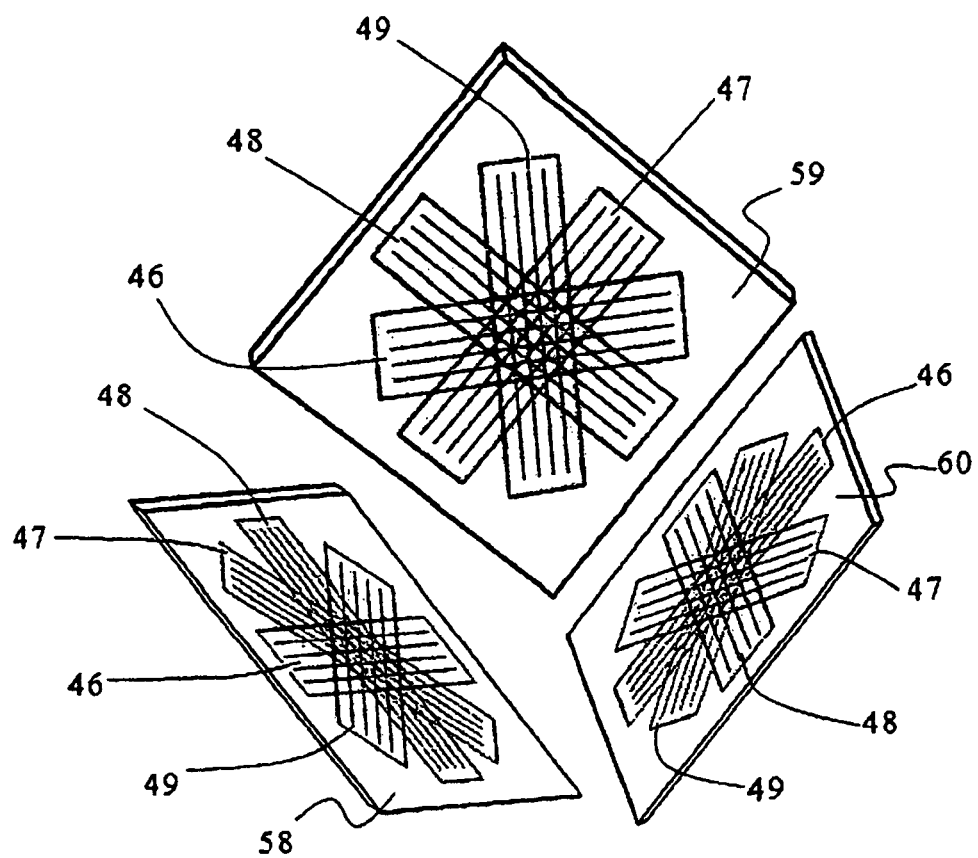
FIG. 13 is a mildly perspective view of three components similar to the components seen in FIG. 12, the three components partially disposed in proximate positions in skewed planes in three-dimensional space.
Figure 14:
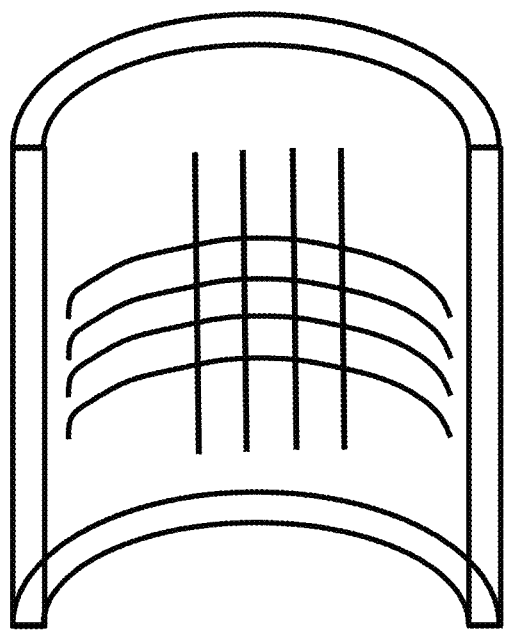
FIG. 14 is a mildly perspective view of a shim component useable in the system of the present disclosure, with a collection of wire coils substantially similar to those of FIG. 9, mounted on or in a concavo-convex substrate structure.

It is readily appreciated by one skilled in the art that a system according to the present disclosure may feature still other alternative embodiments having a number of different substrate structures in a variety of different configurations and positional relationships. FIG. 13 for example, illustrates three generally planar substrate structures 58, 59, 60, each structure containing four wire groups 46-49. It is to be understood that each particular structure 58, 59, or 60 could have wire groups differing in number from the number(s) of groups in one, some, or all, of the other substrate structures. Further and again, each individual wire group 46, 47, or 49 selectively may have different numbers of member wires 20 in the group. The substrate structures 58-60 depicted in FIG. 13 are seen arranged in a generalized configuration, not necessarily parallel to each other.

As suggested by FIGS. 11-13, therefore the presently disclosed magnetic field adjustment system may feature at least one substrate structure 58 that is much like a square or rectangular tile, having a pair of substantially planar exterior surfaces. However, the plan profile is not limited to rectilinear; circular "tiles" or structures of other suitable plan profiles are within the scope of the invention. And the number of substrate structures (e.g., 58, 59, 60) deployed may be one and only one, or may be two and only two such structures, as suggested by FIG. 12. Or, the substrate structures of a shim may number at least two, such as three (FIG. 13) or more.

Further, a given substrate structure 58 need not define only a planar "tile-like" shape, that is, a structure having a pair of substantially planar principal exterior surfaces, as seen in FIGS. 11-13. One or more substrate structure(s) in any particular system according to the present disclosure optionally may have a pair of substantially parallel exterior surfaces curved in at least one dimension, to manifest a concavo-convex shape such as the shape of the substrate structure 61 seen in FIG. 14. The use of such a curved substrate structure 61 mounting one or more wire groups 40 may be suggested by a particularly sought correction field definition. Thus one or more substrate structures 61 in a system may have a pair of substantially parallel exterior surfaces curved in at least one dimension.

The invention may be practiced using a variety of electrical connection configurations. The system according to the present disclosure employs a controller from which an electrical current is provided and by which amperage in a wire may be regulated. The electrical controller is connected electrically to the wires in each group of wires, for regulating a current in each wire. There is provided in all embodiments at least one path, in operative association with each of the wire groups 40, for returning current to the controller 64 from the associated wire group.

Figure 15:
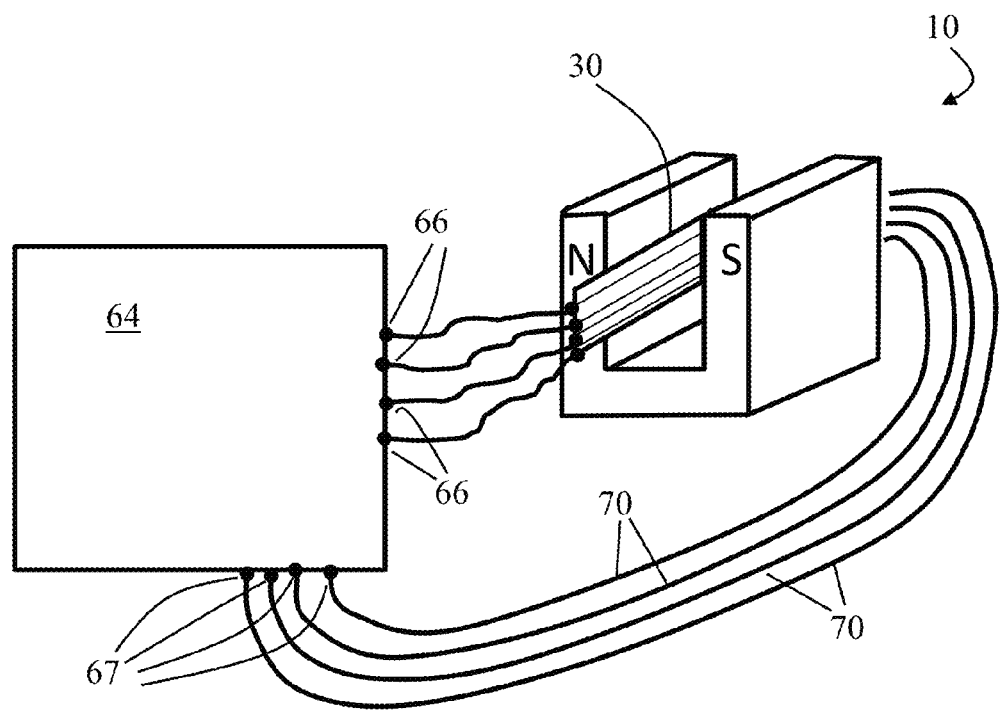
FIG. 15 is a perspective diagrammatic view of one embodiment of a system according to the present disclosure, showing electrical connection relationships between a controller, a simple example shim, and a magnet.

In the simple embodiment of FIG. 15, for example, the controller 64 is seen in operative association with a magnet 10 and a shim paddle 30 having a substrate structure mounting a group of four wires. The current outputs 66 are seen at the right-hand side of the controller 64. Four current outputs 66 are shown in FIG. 15, individually connecting electrically to four corresponding wires 20 on a proximate end of a planar shim paddle 30 which, in FIG. 15, mounts one wire group in a single orientation. The current return paths 70 are connected to the distal end of the structure 58 of the shim paddle 30, and extend to respective current inputs 67 on a bottom edge of the controller 64. Each of the four shim wires 20 in this example is individually connected with an associated return path 70 to the controller 64. The controller 64 can be operated to regulate the current flow in each individual wire 20 of the group 40 on the simple paddle 30, independently of the flow in the other wires of the group. It is seen that the various return paths 70 are routed outside the magnet 10 in whose gap 14 the shim paddle 30 is situated. However, it is not required to pass the current return paths outside the magnet 10. Thus, in this example embodiment, the four (or more, of course) grouped wires 20 of the shim are independently connected to the current output 66 of the controller 64, and each of the wires 20 in the group also has an independent return path 70 to the controller 64. Accordingly, in selected embodiments, there is at least one entire current return path which passes around the outside of the magnet 10, such that none of the one or more paths 70 is disposed through the magnet's interior (i.e., through a magnet gap 14).

Figure 16:
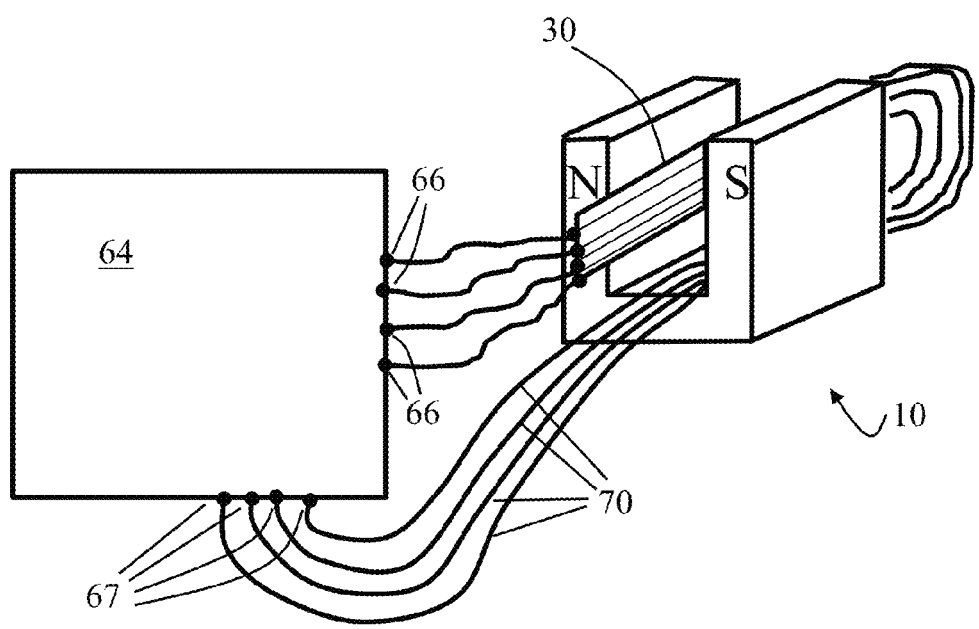
FIG. 16 is a perspective diagrammatic view of another embodiment of a system according to the present disclosure, showing alternative electrical connection relationships between a controller, a simple shim, and a magnet.

In other, alternative, embodiments, it may be desirable to route one or more of the current return paths 70 back through the magnet 10 (e.g., though the magnet gap 14) containing the shim paddle structure, as seen in FIG. 16. As in the example of FIG. 15, four independent wires 20 and current return paths 70 are shown. The current return paths 70 pass through the magnet 10, in the sense that they are disposed through the magnet gap 14 between the poles 11, 12.

Figure 17:
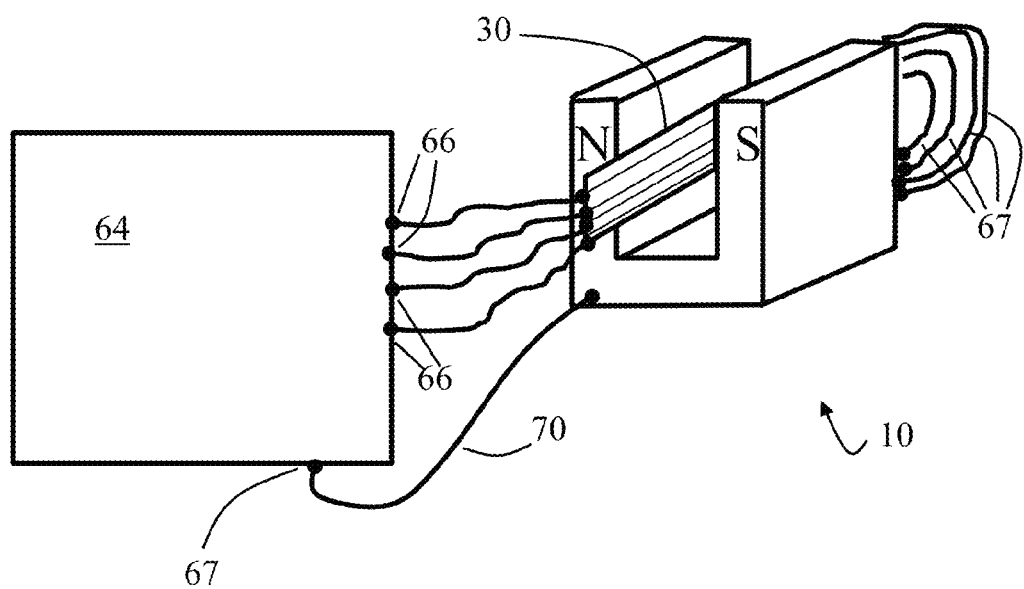
FIG. 17 is a perspective diagrammatic view of yet another embodiment of a system according to the present disclosure, showing still other alternative electrical connection relationships between a controller, a simple shim, and a magnet.

As indicated by FIGS. 15 and 16, selected embodiments of the system and apparatus thus feature one or more paths, in operative association with each of the wire groups 40, for returning current to the controller 64 from the associated group of wires. In FIGS. 15 and 16, it is seen that in selected embodiments, each particular wire 20 in a given group 40 is operatively connected to one current return path 70 dedicated solely to the particular wire. FIG. 17 shows, however, that other embodiments may have a single common return path (e.g., including path 70 in FIG. 17) for all the wires in a particular corresponding wire group (e.g., the wires on the single substrate structure 30 depicted in FIG. 17).

Attention is invited to FIG. 17, illustrating schematically an alternative example of current return routing. In this version of the system, one or more current return paths incorporate at least a portion of the magnet 10 itself. As illustrated by way of example, this simple embodiment includes four independent current leads from the current outputs 66 of the controller 64 to the four wires 20 at the proximate end of the structure of the shim paddle 30. Each of the four wires 20, however, is independently connected to the magnet 10 by intermediate leads 63 running from the distal end of the paddle 30 for electrical connection to the body of the magnet 10 itself. In this embodiment, the current returns are back to the controller via a single common path 70 extending from the magnet 10 to the current input 67 of the controller 64. Accordingly, the current outputs 66 of the controller 64 are independently connected to the four wires 20 in the given group of the shim. The wires 20 are all connected electrically together on the distal end of the structure of the shim 30, and this common connection is then connected to the controller 64 via a common lead forming a single current return path 70.

A preferred arrangement would be to use one of the shim wires 20 as a current return path. Perhaps the most elegant way to practice the invention is to have the algebraic sum of the currents in any given group 40 be approximately zero. Having the currents in a wire group algebraically sum to nearly or exactly zero both simplifies the construction of the apparatus and system, but also the adjustment of the currents for an optimal magnetic field.

If there are return paths 70 that are not intended to contribute to the shim field, then such path wires preferably are located so that their generated fields by do not contribute to the field. It is possible in various embodiments that such location could be through the magnet structure 10 (FIG. 16), or it may need to be around the outside of the magnet (FIG. 15). Going through the magnet structure, as though its magnet gap 14, may be attractive from the standpoint of maximizing the compactness of the field correction apparatus according to this disclosure. However, there may in some situations be reasons not to route even a subset of the current return path wires 70 through the magnet 10. The connections to the shim substrate structures may make such routing awkward for some of the return wires. Or, there may be inadequate space to route all of the return wires through the magnet. It may be possible, in some applications, to route the return wires 70 that carry constant current through the magnet, but the returns for the wires whose current values may be variable in use, such as when pulsed field gradients are used, may need to be routed around the exterior of the overall magnet structure, as indicated in FIG. 15.

It may also be the case that an existing shim control structure is modified, such as for the adding of new wires to achieve a different correction field, the addition of more wires to carry more total current, or another reason to upgrade an existing field correction apparatus and system. In this case, it may be advantageous to leave the original field correction apparatus in place and install the new portions of the device as an additional module. The original device may have all or some of its return connections installed through the magnet structure 10 (FIG. 16), but it may be advantageous to have the wires of the additional module return via the outside of the magnet (FIG. 15). Still, it may be advantageous to have the wires of the additional module return through the magnet structure 10, for example, if this allows the simple insertion of the new structure into the magnet without the need to thread the return path wires through the magnet to be returned to the current controller 64 along a route lying outside the magnet.

Furthermore, it may be advantageous to design a modular field control system, such that modules can be added or removed from the magnet in order to optimize the magnet and its correction apparatus differently for various experimental requirements. For example, it may be useful to have a basic field correction apparatus permanently installed, with return wire connections that may be through the magnet or via the outside of the magnet, or a combination of these; and then have modules of further field correction panels that can be implemented or not depending on the experimental requirements.

Accordingly, it is within the scope of the present invention to have some of the current return paths 70 pass through the magnet gap, and other return paths of the same system pass around the outside of the magnet structure. The circumstances of a given application or system modification will suggest adaptations according to knowledge in the art.

Figure 18:
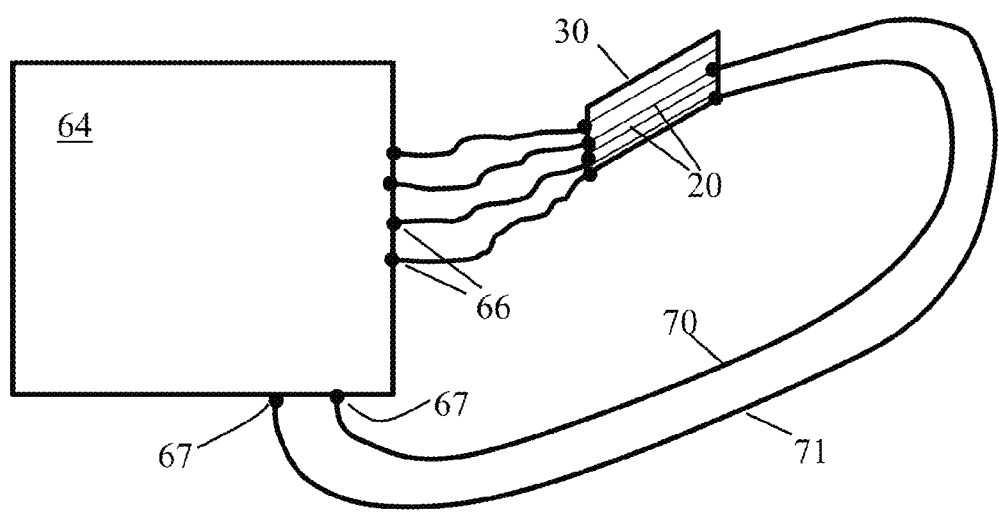
FIG. 18 is a schematic diagram illustrating a basic electrical connection relationship between an electrical controller and a basic shim structure mounting a single wire group.

Alternative wire connection schemes are possible, desirable in some applications, and within the scope of the invention. For example, as seen in FIG. 18, the number of current outputs 66 at the controller 64, with leads to the proximate end of the shim paddle 30 structure, exceeds the number of current return paths. In the example configuration of FIG. 18, the four wires 20 of the wire group in the single substrate structure 58 are connected in two pairs. A single output lead connects each controller current output 66 to a particular one of the wires 20 at the proximate end of the paddle structure 30. However, each pair of wires 20 shares a commonly shared return path 70 or 71 to the inputs 67 of controller 64. Accordingly, each of four leads independently supplies current to a single wire 20 in the wire group of the shim 30, while two current return paths 70, 71, each connected to an associated pair of shim wires, return to the inputs of the controller 64. It is seen from the embodiment of FIG. 18, therefore, that first ends of the wires 20 of at least one of the groups 40 in a substrate structure of a shim in a system are separately connected electrically with the controller 64 such that electrical current in each wire in the group may be regulated independently by means of the controller, while second ends of at least one pair of the wires 20, of the at least one of the wire groups in the system, are connected electrically together. The controller 64 in turn is connected electrically to the connected second ends of the at least one pair of wires 20 so that current can flow (e.g., via return paths 70, 71 in operative association with corresponding pairs of wires) between the connected second ends of the at least one associated pair of wires and the controller.

Figure 19:
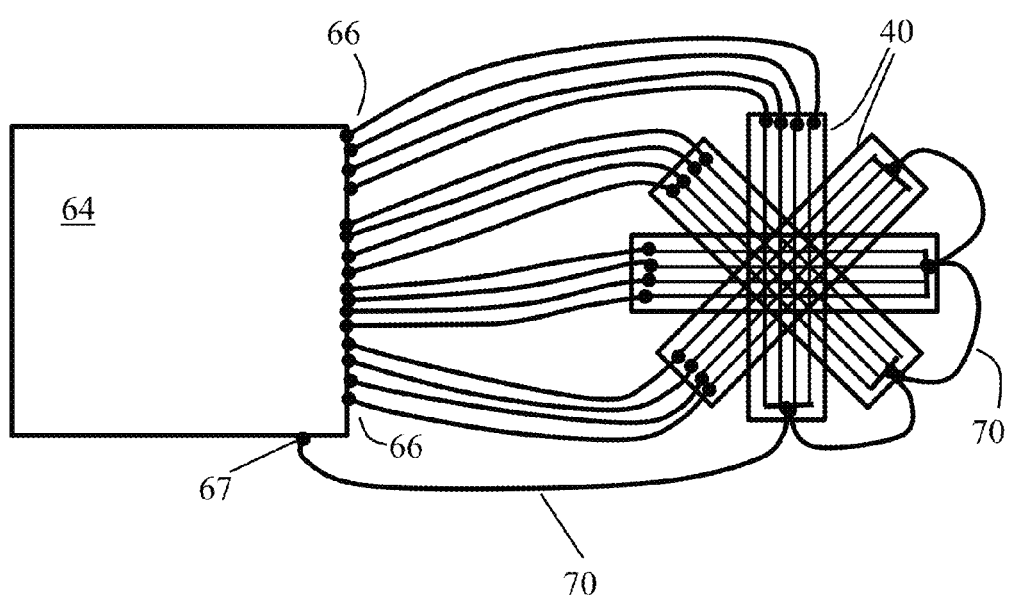
FIG. 19 is a schematic diagram illustrating an alternative electrical connection relationship in an embodiment of the system with an electrical controller and a shim structure having four wire groups.

Attention is invited to FIG. 19, diagramming an example of a more sophisticated (and more likely) means of connection between a controller 64 and groups 40 of wires 20 in substrate structure(s) 58 in a shim according to the present system. In this example, the shim paddle contains four groups 40 in four different orientations, each group having four wires 20 (e.g., generally in accordance with FIG. 9). As seen in the figure, at a first end of each group 40, the end of each wire in the group is electrically connected by a discrete lead back to a single corresponding controller output 66. At the second end of each group 40, the wires in the group have their ends in electrical communication with each other, and this electrical junction then is in electoral communication with a single return path 70 to a single corresponding controller input 67.

Thus each wire in a group has its own discrete connection with the controller 64, but all the wires in the group share a common connection with the controller input 67 via the group's associated return path. So, in the depicted embodiment, the four wires 20 in all four groups 40 each is connected independently to a respective current output 66 of the controller 64. All four wires 20 in each of all the groups 40 share a single return path 70 to the controller 64. By this configuration, first ends of the wires of at least one of the groups 40 in a system are separately connected electrically with the controller 64 such that electrical current in each individual wire in the group may be regulated independently of the current in the other wires of that group, second ends of the wires of the at least one of the groups 40 are connected electrically together, allowing the controller 64 to be connected electrically to the second ends of the wires such that current can flow, via that group's return path 70, between the second ends of the wires and the controller. In this embodiment of FIG. 19, therefore, all the wires 20 in all the groups 40 in the system share a common current return path 70.

Figure 20:
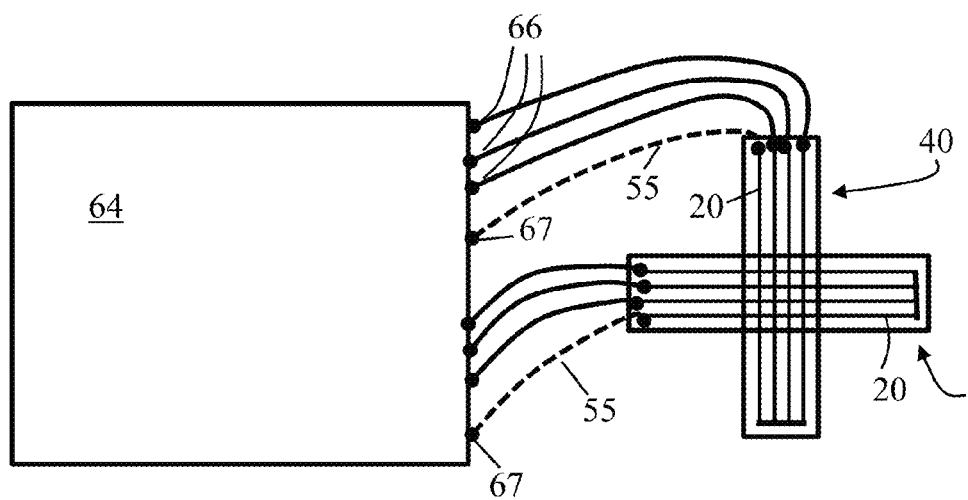
FIG. 20 is a schematic diagram illustrating an alternative electrical connection relationship in yet another possible embodiment of the system with an electrical controller and a shim structure having two wire groups.

FIG. 20 diagrams an alternative means of connection between a controller 64 and groups 40 of wires 20 in a substrate structure of a shim. In this example, the structure contains two wire groups 40 arranged in two orientations (e.g., generally in accordance with FIG. 8). Each group 40 contains (again, by way of non-limiting example) four wires 20, with three wires connected independently (from one end of the group) to current outputs 66 of the controller 64. The wires 20 in each group 40 are connected together at their ends at the other end of the group. A fourth wire 20 in each group 40 is connected with a lead 55 (shown by a dashed line in the figure) back to a current input 67 of the controller 64, thus forming the current return path 70. By this configuration exemplified in FIG. 20, first ends of the wires 20 of at least one of the wire groups 40, except a first end of a remaining wire in the group, are separately connected electrically with the controller 64 such that electrical current in each wire 20 in the particular group 40, except the remaining wire, may be regulated independently, while second ends of all the wires 20 of the at least one of the wire groups are connected electrically together. Accordingly, the controller 64 is so connected to the remaining wire such that current can flow, via the extras wire or lead 55, between the first end of the remaining wire and the controller 64.

According to the foregoing, a preferred embodiment of the system according to the present disclosure is usable for manipulating the magnetic field of a magnet 10. A basic version of the system has at least one, preferably more, of the substrate structures 58. Each substrate structure mounts N groups of substantially straight parallel wires 20, wherein N is the integer number of groups greater than one. The electrical controller 64, connected electrically to wires in each group 40, is for regulating a current in each wire. In a preferred embodiment of the apparatus and system, each group of wires includes at least four wires disposed in at least one layer in a substrate structure (e.g. structure 58). An important, but not critically essential aspect of the inventive system is that groups of wires are arranged in a plurality of orientations, such orientations having different spatial relations to each other, with any one group defining an angle of approximately 180°/N with a second group most closely aligned with the one group.

The set of current values needed to homogenize a particular magnet may be determined in any of a variety of ways. One mode is to adjust the currents one by one and monitor the homogeneity of the original magnet's field at the sample (in the sample region 18). Such monitoring can be achieved by measuring the line width of the NMR signal, which is an indication of the distribution of field values throughout the sample working volume. The field homogeneity may also be monitored by mapping the field, that is, by measuring the field at individual locations throughout the anticipated sample volume. The field may be mapped by a small, movable NMR sample and coil, or by non-NMR means, such as by Hall probe measurements. Alternatively, the field contributed by each individual wire may be mapped or calculated. Then the field due to the magnet 10 itself may be mapped with no current present on any of the shim wires 20. Then the field map of the magnet 10 may be decomposed into the fields created by the individual wires using any of a number of mathematical means, including least squares fitting of the current values to minimize some mathematical definition of the degree of non-homogeneity.

In some circumstances, it may be preferable to calculate the current distributions required to produce well-known, simple correction terms. The effects of adjustments to these standard terms are normally well-known to those skilled in the art of shimming magnets, and are more readily learned by novices than the more general methods described above. As an example, we have calculated the current distributions required to produce a linear Y shim and the quadratic $Z^2-Y^2$ shim, using an array of sixteen straight wires in one direction, eight wires on one side of the magnet gap 14 and eight wires on the other. The wires 20 are located, for example, as shown in the FIG. 21. These wires are not evenly spaced. In the calculation, the wires are located at positions (Y,Z) of the form (0.5,1), (1,1), (1.5,1), (2,1) and similar, symmetry related locations.

To create the Y shim, the currents given in the second column of Table 1 below may be used. These currents are all normalized to the value of the current in wire No. 1. To create the $Z^2-Y^2$ shim, the currents in the third column may be used.

TABLE 1

Table 1: Normalized shim currents

| Wire | Y | $Z^2 - Y^2$ |
|---|---|---|
| 1 | 1 | 1 |
| 2 | −0.251 | −0.294 |
| 3 | 0.020 | 0.022 |
| 4 | 0.004 | −0.001 |
| 5 | 0.004 | 0.001 |
| 6 | 0.020 | −0.022 |
| 7 | −0.251 | 0.294 |
| 8 | 1 | −1 |
| 9 | 1 | 1 |
| 10 | −0.251 | −0.294 |
| 11 | 0.020 | 0.022 |
| 12 | 0.004 | −0.001 |
| 13 | 0.004 | 0.001 |
| 14 | 0.020 | −0.022 |
| 15 | −0.251 | 0.294 |
| 16 | 1 | −1 |

Figure 21:
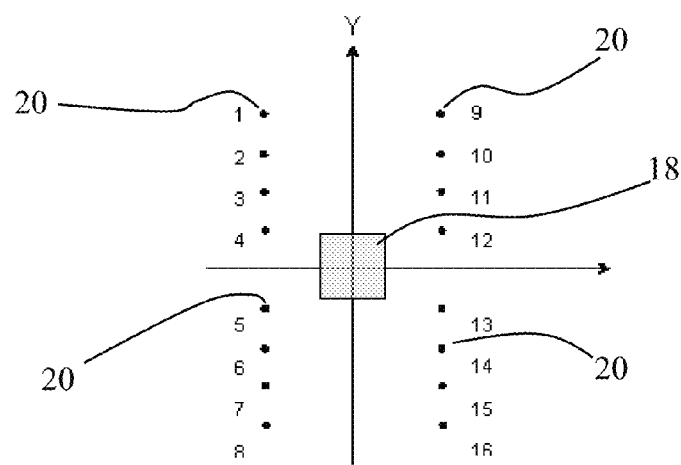
FIG. 21 is a diagrammatic side view of yet another alternative embodiment of the a portion of a system according to the present disclosure, showing a group of eight shim wires disposed on a first side of a sample volume, and a group of eight shim wires disposed on a second side of the sample volume.
Figure 22A:
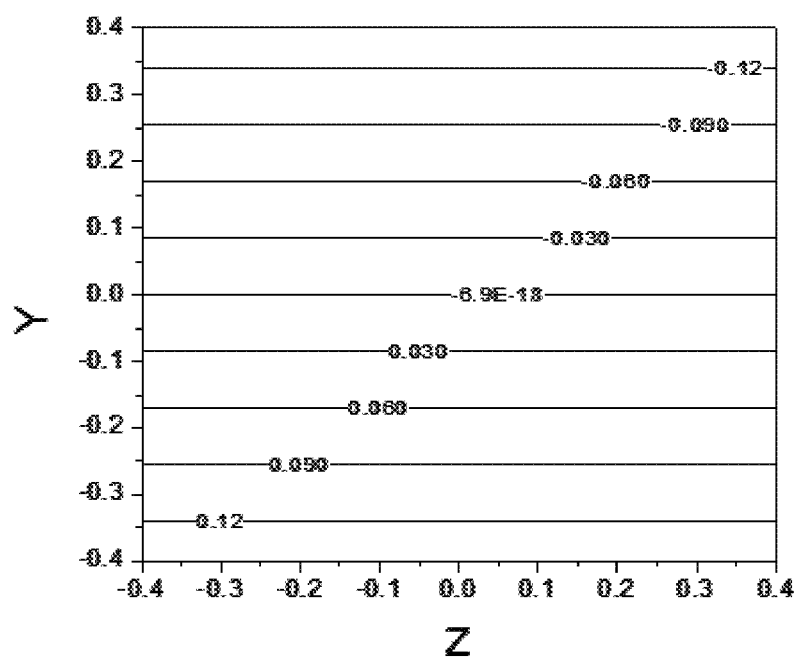
FIGS. 22A-B are a pair of graphs illustrating the creation of a highly linear shim field by a proper distribution of current values, and indicating that the $Z^2$—$Y^2$ shim field has a desired quadratic shape, distinct from the linear shape of the Y shim.
Figure 22B:
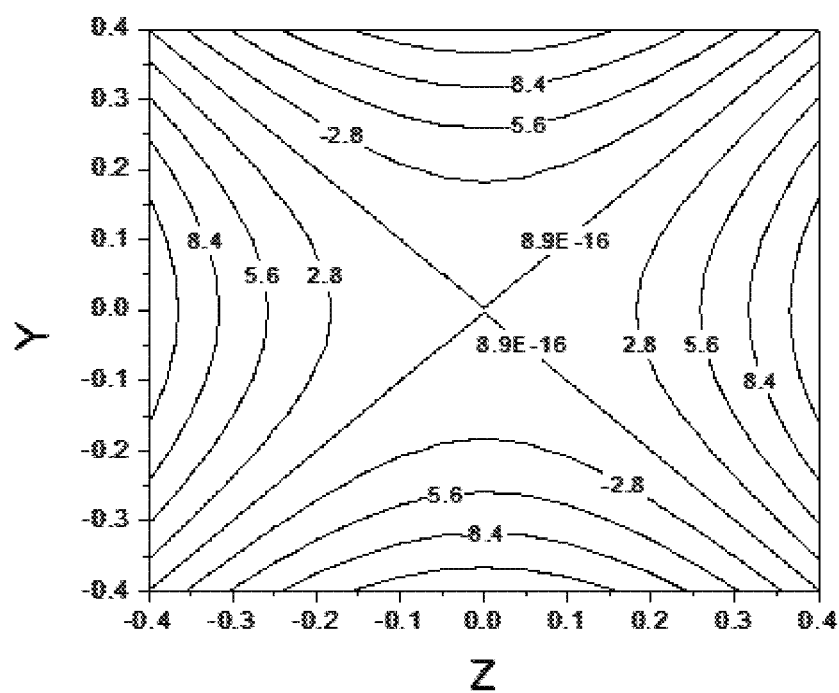

The resulting magnetic fields created by either of these sets of currents on this set of wires, plotted over the sample region shown in FIG. 21, are given in FIG. 22A-B.

Reference is made to FIG. 22A, indicating that a highly linear shim field, desired for the Y shim term, can be created by a proper distribution of current values. FIG. 22B also indicates that the $Z^2-Y^2$ shim field has the desired quadratic shape, distinct from the linear shape of the Y shim. Note that the same wires are used to create both of these standard shim terms.

Any of a large number of methods may be used to calculate the current values needed to create particular shim fields. For example, one could calculate the field due to each individual wire and then seek the linear combination of such fields that best approximates the desired field profile. Linear programming methods, least squares fitting, target field methods, or any other suitable mathematical approach may be used to find the currents. Trial and error methods, genetic algorithms, simulated annealing, or other optimization methods may be used. Combination of methods may be useful; for example, one method to provide an approximate current distribution combined with another method to refine the current values to improve the quality of the resulting shim field.

The method used to determine the currents required to produce the shim fields shown in FIG. 22 above are based on the earlier work of W. A. Anderson described in "Electrical Current Shims for Correcting Magnetic Fields," Rev. Sci. Inst., vol. 32, pages 241-250 (1961). In this approach, symmetry arguments are used to reduce the required calculation to a single set of four wires in any one of the quadrants shown in FIG. 22, for example, wires numbers 1, 2, 3, and 4 (FIG. 21). The current of one wire is set to a value of 1 (as was done for wire No. 1, above). The currents for the other wires were determined by minimizing the production of the first unwanted field derivative at a collection of points in the anticipated sample volume, accounting for the fact that many field derivatives would be zero due to symmetry. For example, to calculate the currents for the Y shim, the production of the third Y derivative was minimized over a set of seventeen points spread evenly along the Y axis.

Other approaches to calculating the distribution of currents to produce particular shim terms (taken from any particular set of mathematical functions) are possible. It may also be desirable to include further constraints on the current distributions, for example, a constraint that the total current for the shim term be algebraically zero. It may also be advantageous to orthogonalize the fields for the individual terms by modifying the calculated currents. Various methods from the mathematics may be employed to achieve orthogonalization. Such orthogonalization may be helpful whenever changes are made to the size and/or position of the anticipated sample region.

To create higher order gradients, it may be necessary or useful to include more wire orientations. For example, the four orientations located midway between the neighboring pairs of orientations seen in FIG. 4 may be included. Including these will require more layers in the substrate structure (e.g., PCB), but this may be accomplished without compromising the working space within the magnet 10.

The electrical current in each of the wires 20 in each of the groups 40 in each of the substrate structures 58 may all need to be adjusted to achieve the desired field correction or the desired field profile. In some cases, each wire's current will be connected to a separate current source or sink, while in other cases common current sources or sinks may be used for sub-sets of the wire population. Another alternative is that currents in most or all but one of the wires in a subset may be controlled individually, with the current in the remaining wires or wire being the algebraic sum of the currents in the controlled wires.

A current control may be achieved by a current-feedback amplifier designed to source or sink a constant current set by a control voltage. In other cases, the current may be established by a voltage source, or by other means. The current control electronics may be constructed to have multiple stages, in which the output stage controls the current in a single wire, while the earlier stages may control multiple output stages at once. The earlier stages may be configured so as to change the current settings in the output stages according to a fixed ratio or set of fixed ratios. The earlier stages may be configured so as to control the output currents of a group of output controllers so as to produce a total current that sums algebraically to zero. The methods by which the earlier stages control their various output stages may be analog methods, such as resistor voltage dividers or fixed-gain operational amplifiers, or they may be digital methods, such as microprocessors, programmable gate arrays, field-programmable gate arrays, digital signal processors, and the like. Other methods for controlling groups of individual output stages in a useful manner may be employed. For example, the output stages may be controlled directly from a computer via a digital interface.

The determination of the values of the currents may be by any of a wide variety of methods. A trial and error method may be used, in which the currents in each of the wires may be changed and an assessment made as to whether the magnetic field homogeneity or magnetic field profile has been improved. Improvement may be ascertained via an analysis of the magnetic resonance signal, for example, its longevity or shape or some combination of longevity and shape. The desired shape may be a decaying exponential function. Other figures of merit for field improvement can be used. For example, the height of the peak in the signal's frequency spectrum may be selected as the factor or figure of merit. Alternatively the width of the peak, or its shape, or some combination of shape, width, and height, may be taken as a figure of merit. The desired shape may be a Lorentzian function. Those skilled in the art of shimming magnets using adjustable currents will have their preferred figure of merit, and will readily be able to adopt other figures of merit for ascertaining the improvement of the magnetic field. Alternatively, those skilled in the art will be able to develop new figures of merit that address features peculiar to the new shim coil design.

The trial and error adjustment method may proceed in a variety of ways. The current in one of the wires may be changed and an assessment made whether the field produced by the entire set of shim coils has been improved. If improvement is seen, then the same current may be changed further in the same sense as the first adjustment and another assessment of improvement may be made. Alternatively, if improvement is not observed or if the field has been made worse, then an adjustment to the current in the opposite sense may be made. If further improvement is observed, the process may be repeated until improvement ceases. Alternatively, the process may proceed only for a number of iterations and may cease before decrease in improvement is observed. In one example methodology, only one adjustment is made. The current of a second wire may now be adjusted following a similar procedure as for the first wire. The current in each wire may now be adjusted following a similar procedure. A subset of the wires currents may be adjusted rather than the entire set.

The order in which the wire currents are adjusted may be predetermined. A subset of the wires, for example the groups of wires contributing to a particular mathematical order of the correction, may be adjusted as a group. The wires or groups of wires may be adjusted one at a time, with wires that had been adjusted earlier being readjusted after other wire currents had been changed. A group of wire currents that had been adjusted, perhaps iteratively, may be readjusted after a group of wires besides the group had been changed. Different subsets of wires may be adjusted in concert, for example, current in two or more subsets of wires may be adjusted at the same time and treated as a single adjustment for the purposes of ascertaining whether the field had been improved. One or more subsets of wire currents may be adjusted, and then another subset or collection of subsets may be adjusted to optimize the resulting potential improvement, before the effect of the change to the first subset or subsets is assessed. Those skilled in the art of shimming will recognize that combinations of these techniques, as well as deviations from the predetermined plan of adjustment, may be implemented.

The adjustments to some or all of the wire currents may be made manually, or may be made under digital or computer control, or some combination of manual and digital methods. Computations, as may be performed on a computer, for example, may be used to determine the quality of the signal or the figure of merit for guiding current adjustments. The process may be programmed to follow a strict adjustment protocol and/or algorithm. The adjustment process may be managed completely by a computer or microprocessor or similar digital device, or there may be a combination of automatic and manual adjustment. For example, a computer may be used to perform an initial field homogeneity or field profile optimization, after which manual adjustments may be made to fine-tune the adjustment. The algorithm may be changed during the current optimization process. For example, the figure of merit used to judge improvement may be changed as the field homogeneity improves. For another example, the size of the current changes used in a trial and error search may be made larger or smaller. As a further example, the order in which the currents are adjusted, or the grouping of the wires to be adjusted in groups, may change. The choice of shimming protocol and the details of each such protocol may be changed in response to alterations in the sample size, sample material, temperature of the magnet or of the sample, surroundings of the magnet, or any other change in the conditions of the use of the magnet that may make a change in the shimming protocol advantageous. The shimming protocol may be different if the field is to be homogenized as compared to when a specific non-homogeneous field profile is desired.

In a preferred approach, the currents on the wires needed to produce particular mathematical field correction terms, as described above, are calculated. For example, the currents needed to produce magnetic field corrections corresponding to each of the spherical harmonics may be calculated. The currents needed may be determined up to an overall multiplicative constant. This constant may determine the overall strength of the correction term. The terms so calculated may be selected so that they are mathematically orthogonal over the sample region of interest, so that adjustments to the strength of one such term will minimally affect the optimization of previously adjusted terms. In this approach, the currents on many wires are adjusted when the strength of a mathematical correction term is changed. The currents on some or all of the same wires may be adjusted when the strength of a second correction term is changed. The two correction terms may not share any wires, may share some wires, or may have all of their wires in common. The current control electronics may be constructed so that the current on any one wire is the sum of the currents needed to produce all of the correction terms being applied to the magnetic field. The methods for summing all of the required current values to form an algebraic total value are well known to those skilled in the art. For example, an operational amplifier circuit designed to operate as a summing amplifier may be used. In the preferred approach, it may be useful to calculate the current distribution on all of the wires that is useful for producing an approximation to the desired correction field or term, provide a set of input controls to the current controller with each input control functioning as an amplitude control for each of the desired terms, and calculating the mathematical matrix that describes the transformation between the input control settings and the output current values.

In another of the many methods for correcting a magnetic field, it may be useful to measure the value of the magnetic field to be corrected at points in space spanning the region over which the field is to be corrected. These points may lie on the perimeter of the correction space, in the interior of the correction space, or both. The field values may be measured using a variety of magnetic measurement methods, including Hall probes, NMR probes, and the like. The set of field values constitutes a map of the magnet field to be corrected. The fields of the various correction terms may also be mapped, either via measurement of the fields they produce, or by calculation from the known current distribution. The field error, or deviation from the desired field homogeneity or profile, may then be decomposed into contributions from each of the correction fields so that the strength of the contribution of each correction may be determined deterministically. This determination may be achieved using any of a number of mathematical techniques, broadly called solvers, which may include linear least squares fitting, linear programming, techniques involving linear algebraic techniques including matrix inversion, or any other method that performs this desired decomposition. The mathematical calculation may result directly in the values of the currents on the wires that create the best possible correction. The decomposition may be in terms of the fields from each wire individually, groups of wires chosen arbitrarily, groups of wires for which known ratios of currents produce a mathematical term of correcting field, or any other decomposition that is advantageous.

In an alternative method for field mapping, the distribution of magnetic field values throughout the sample space may be determined via MRI methods. This may be achieved using gradient recalled echo techniques, in which the phase difference between images collected at two echo times may be used to produce an image of the field inhomogeneity or profile to be adjusted or corrected. Other MRI methods may be used as appropriate to create the image of the field values. This image may be used as a field map, as described above, to determine the needed value of the field correction currents or groups of currents needed to correct the field.

Any of the current adjustment methods described above may be used in concert with any of the other methods, or with other methods devised by those skilled in the art. The methods may be used iteratively, in a set sequence, or in a sequence determined by a skilled operator during the process of adjusting the currents, ultimately via the controller 64 to achieve the desired effect. At each stage of the process, the method best suited to achieve further improvement may be employed.

Methods and modes according to the present invention are evident from the foregoing. The basic process is to adjust the current in some or all of the wires to achieve the desired effect on the magnetic field of the original or target magnet. The adjustment process is achieved by techniques including steps to execute deterministic, manual, automatic, trial and error searching, simulation, calculation, or matrix manipulation methodologies.

For field correcting systems with many wires according to the present system, which may be capable of generating correction fields of high mathematical order, the mathematical or experimental task of determining the currents needed to create the various mathematical terms, and/or the process of decomposing the field to be corrected into contributions from each wire or each mathematical term, and/or the precision and number of field locations mapped by field measurement, and/or the trial and error search for the setting of the currents that best correct the magnetic field to produce the desired homogeneity or field profile, and/or the electronics required to control the currents and respond the current control inputs, and/or the manual or digital algorithm for setting the current values, may be substantially more complex or demanding than the corresponding equipment, calculation, or method used in existing field correction apparatus. The process may require more time to implement, or more computing power, or more iterations to achieve the desired corrections than the corresponding process for existing field correction apparatus.

Yet the advantage of the presently described inventive system and method is that this current control and adjustment complexity may be handled by known means, and may be handled by a portion of the field correction apparatus that is not physically constrained by the size or shape of the original magnet structure. The shim coils themselves, which may need to occupy a location in space that may be needed for other portions of the overall device, for example may be needed to contain the sample, can be kept very simple in design and hence may be constructed in a very compact manner.

The preferred embodiment is optimal for use in dipole magnets, with opposing north and south pole faces that define the magnet gap. Other magnet platforms may also be improved by the new shim coil system, including Halbach magnets, unilateral magnets, solenoidal magnets, and other magnets. For particular situations, it may be advantageous to lay out the new shim design on a curved surface.

The shim sets may be used to create a particular field inhomogeneity, or particular shape of magnetic field, rather than simply being used to maximize the field homogeneity.

The presently disclosed shims configurations and modes may be used in combination with other shim designs. For example, the presently disclosed shim apparatuses may be installed in a magnet, and a second set of linear shims of the instant or old design may be installed and used for Magnetic Resonance Imaging, diffusion, or other measurements, by pulsing the current on the second set of linear shims. Alternatively, the currents used to create linear gradients in the shim paddles described in this invention may be pulsed to perform experiments requiring pulsed magnetic field gradients.

By way of further example, the presently disclosed shim design may be installed in a magnet together with a second coil designed to compensate for as much of the known field inhomogeneity as possible. Such a second coil might be designed by mapping the field of the magnet without any shim currents on, and laying out this second coil to create the field needed to correct the inhomogeneities of the un-shimmed magnet.

In sum, there is provided according to this disclosure a system for manipulating a magnetic field. The system includes a magnet for generating a first magnetic field, at least one substrate structure positioned generally proximate to the magnet, each of the substrate structures mounting N groups of substantially straight parallel wires (wherein N is the integer number of groups greater than one), and an electrical controller, connected electrically to the wires in each group, for regulating a current in the wires. Each wire group preferably has at least four wires disposed on or in the substrate structure, and the groups of wires are arranged in a plurality of orientations in relation to each other, with any one group defining an angle of approximately 180°/N with a second group most closely aligned with the one group. The regulation of current in the wires produces a second magnetic field which affects an alteration in the magnetic field generated by the magnet. The alteration in the first magnetic field is an improvement in the field's homogeneity. Alternatively, the alteration in the first magnetic field comprises an improvement in a selected field distribution.

Although the invention has been described in detail with particular reference to these preferred embodiments, other embodiments can achieve the same results. And while the present invention has been particularly illustrated and described with reference to exemplary embodiments thereof, it will be understood by those of ordinary skill in the art that various changes in form and details may be made therein without departing from the spirit and scope of the present invention as defined by the following claims. Therefore, it is to be understood that the above-described exemplary embodiments have been provided only in a descriptive sense and will not be construed as placing any limitation on the scope of the invention. Variations and modifications of the present invention will be obvious to those skilled in the art and it is intended to cover in the appended claims all such modifications and equivalents.

I claim:

1. An apparatus for use with a magnet, the apparatus comprising:
   at least one substrate structure, each substrate structure mounting N groups of substantially straight parallel wires, wherein N is an integer number of groups greater than one; and
   an electrical controller, connected electrically to the wires in each group, for regulating a current in at least one of the wires in the group;
   wherein first ends of the wires of at least one of the groups are separately connected electrically with the controller such that electrical current in each wire in the group may be regulated independently;
   wherein each group comprises a plurality of wires disposed on or in the substrate structure; and
   wherein groups of wires are arranged in a plurality of different spatial orientations, with any one group defining an angle of approximately 180°/N with a second group most closely aligned with the one group.

2. An apparatus according to claim 1 wherein the at least one substrate structure comprises a pair of substantially planar exterior surfaces.

3. An apparatus according to claim 1 wherein the at least one substrate structure comprises a pair of substantially parallel exterior surfaces curved in at least one dimension.

4. An apparatus according to claim 1 wherein the at least one substrate structure comprises only one structure.

5. An apparatus according to claim 1 wherein the at least one substrate structure comprises two structures.

6. An apparatus according to claim 5 wherein the two structures are substantially parallel.

7. An apparatus according to claim 1 wherein the at least one substrate structure comprises at least two structures.

8. An apparatus according to claim 1 wherein the integer N is selected from the group consisting of 2, 4, 6, and 8.

9. An apparatus according to claim 1 wherein the wires in at least one group are spaced one from another by uniform separation distances.

10. An apparatus according to claim 1 wherein the wires in at least one group are spaced one from another by non-uniform separation distances.

11. An apparatus according to claim 1, wherein:
    second ends of at least one pair of wires of the at least one of the groups are connected electrically together; and
    the controller is connected electrically to the connected second ends of the at least one pair of wires such that current can flow between the connected second ends of the at least one pair of wires and the controller.

12. An apparatus according to claim 1, wherein:
    all the first ends of the wires of at least one of the wire groups, except a first end of a remaining wire in the group, are separately connected electrically with the controller such that electrical current in each wire in the group, except the remaining wire, may be regulated independently;
    second ends of all the wires of the at least one of the groups are connected electrically together; and
    the controller is so connected to the remaining wire such that current can flow between a first end of the remaining wire and the controller.

13. An apparatus according to claim 1 further comprising one or more paths, in operative association with each of the wire groups, for returning current to the controller from the associated group.

14. An apparatus according to claim 13 wherein at least one current return path passes around the outside the magnet.

15. An apparatus according to claim 13 wherein at least one current return path passes through the magnet.

16. An apparatus according to claim 13 wherein the one or more current return paths comprise at least a portion of the magnet.

17. An apparatus according to claim 13 wherein each particular wire in a group is operatively connected to one current return path dedicated solely to the particular wire.

18. An apparatus according to claim 13 wherein at least a pair of wires in a group share a single common current return path.

19. An apparatus according to claim 14 wherein all the wires in a group share a single common current return path.

20. An apparatus according to claim 13 wherein all the wires in all the groups share a common current return path.

21. A system for manipulating a magnetic field, the system comprising:
    a magnet for generating a first magnetic field;
    at least one substrate structure positioned generally proximate to the magnet, each said substrate structure mounting N groups of substantially straight parallel wires, wherein N is the integer number of groups greater than one; and
    an electrical controller, connected electrically to the wires in each group, for regulating a current in each wire, wherein first ends of the wires of at least one of the groups are separately connected electrically with the controller such that the electrical current in each wire in the group may be independently regulated by the controller;
    wherein each group comprises at least four wires disposed on or in the substrate structure;
    wherein the groups of wires are arranged in a plurality of orientations in relation to each other, with any one group defining an angle of approximately 180°/N with a second group most closely aligned with the one group; and
    wherein regulation of current in the wires produces a second magnetic field which affects an alteration in the magnetic field generated by the magnet.

22. A system according to claim 21 wherein the alteration in the first magnetic field comprises an improvement in field homogeneity.

23. A system according to claim 21 wherein the alteration in the first magnetic field comprises an improvement in a selected field distribution.

24. An apparatus for use with a magnet, the apparatus comprising:
    a substrate structure disposed in a magnetic field generated by said magnet;
    N groups of wires mounted on or in the substrate, wherein N is an integer number of groups greater than one;
    each group of wires having a principal axis, the wires of the group disposed substantially parallel to the principal axis of the group;
    each wire having a first end and a second end, and each wire in a group being mounted linearly straight between electrical connections at its first and second ends;

an electrical controller, connected electrically to the wires in each group, for regulating a current in each of the wires in the group;

wherein the first ends of the wires in each of the groups are separately connected electrically with the controller such that electrical current in each wire in the group may be independently regulated by the controller; and wherein the groups of wires are arranged in the substrate structure in a plurality of different spatial orientations, with the principal axis of any one group defining an angle of approximately 180°/N with the principal axis of a second group most closely aligned with the one group, wherein the electrical connections are disposed on more than two edges of the substrate structure.

* * * * *